(12) United States Patent
Sarkas et al.

(10) Patent No.: US 10,448,328 B2
(45) Date of Patent: Oct. 15, 2019

(54) WIRELESS COMMUNICATIONS SYSTEMS WITH ENVELOPE TRACKING CAPABILITIES

(71) Applicant: Apple Inc., Cupertino, CA (US)

(72) Inventors: Ioannis Sarkas, Redwood City, CA (US); Berke Cetinoneri, Santa Clara, CA (US); Evan M. Manrique, Hayward, CA (US); Ryan J. Goedken, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 147 days.

(21) Appl. No.: 15/625,318

(22) Filed: Jun. 16, 2017

(65) Prior Publication Data

US 2018/0368065 A1 Dec. 20, 2018

(51) Int. Cl.

| | |
|---|---|
| *H04B 1/16* | (2006.01) |
| *H04W 52/02* | (2009.01) |
| *H04B 1/40* | (2015.01) |
| *H03F 3/19* | (2006.01) |
| *H03F 3/24* | (2006.01) |
| *H03F 1/32* | (2006.01) |
| *G01R 29/10* | (2006.01) |
| *G01R 29/08* | (2006.01) |
| *H03G 3/30* | (2006.01) |
| *H04B 1/04* | (2006.01) |

(52) U.S. Cl.
CPC .... *H04W 52/0225* (2013.01); *G01R 29/0878* (2013.01); *G01R 29/10* (2013.01); *H03F 1/3241* (2013.01); *H03F 3/19* (2013.01); *H03F 3/245* (2013.01); *H04B 1/40* (2013.01); *H03F 2200/102* (2013.01); *H03F 2200/451* (2013.01); *H03G 3/3042* (2013.01); *H04B 1/0458* (2013.01)

(58) Field of Classification Search
CPC ... G01R 29/0878; G01R 29/10; H03F 1/3241; H03F 2200/102; H03F 2200/451; H03F 3/19; H03F 3/245; H04B 1/40; H04B 1/0458; H04W 52/0225
See application file for complete search history.

(56) References Cited

U.S. PATENT DOCUMENTS

| | | | |
|---|---|---|---|
| 8,818,305 B1 | 8/2014 | Schwent et al. | |
| 9,065,509 B1 * | 6/2015 | Yan | H04B 1/0475 |
| 9,247,496 B2 | 1/2016 | Khlat | |
| 9,331,653 B2 * | 5/2016 | Khesbak | H03G 3/3042 |

(Continued)

*Primary Examiner* — Nhan T Le
(74) *Attorney, Agent, or Firm* — Treyz Law Group, P.C.; Tianyi He

(57) ABSTRACT

An electronic device may include wireless communications circuitry, control circuitry, and sensor circuitry. The wireless communications circuitry may include amplifier circuitry that amplifies radio-frequency signals using on a bias voltage to generate amplified radio-frequency signals transmitted over an antenna. Power supply circuitry may generate the bias voltage based on an envelope mapping setting and an envelope signal associated with the radio-frequency signals. The sensor circuitry may generate sensor data that characterizes the performance of the wireless communications circuitry and provide the sensor data to the control circuitry. The control circuitry may use the provided sensor data to generate control signals for the power supply circuitry. The control signals may adjust the envelope mapping setting of the power supply circuitry.

20 Claims, 9 Drawing Sheets

(56) References Cited

U.S. PATENT DOCUMENTS

| | | |
|---|---|---|
| 9,520,841 B2 | 12/2016 | Langer |
| 9,520,907 B2* | 12/2016 | Peng .................... H04B 1/0475 |
| 9,537,519 B2* | 1/2017 | El-Hassan ............ H03F 1/0227 |
| 9,571,152 B2 | 2/2017 | Ripley |
| 9,594,147 B2 | 3/2017 | Han et al. |
| 2005/0197077 A1* | 9/2005 | Bielmeier ............ G01R 33/543 |
| | | 455/115.1 |
| 2012/0173031 A1* | 7/2012 | Parameswaran .......... H02J 7/35 |
| | | 700/295 |
| 2014/0199949 A1 | 7/2014 | Nagode et al. |
| 2015/0194936 A1 | 7/2015 | Inanoglu et al. |
| 2017/0179889 A1 | 6/2017 | Khesbak et al. |

* cited by examiner

WIRELESS COMMUNICATIONS SYSTEMS WITH ENVELOPE TRACKING CAPABILITIES

BACKGROUND

This relates generally to wireless communications circuitry, and more particularly, to electronic devices having wireless communications circuitry.

Electronic devices are often provided with wireless communications capabilities. For example, handheld electronic devices may use cellular telephone communications standards to communicate with cellular networks. Handheld electronic devices typically have a limited battery capacity that is used for performing wireless communications. Unless care is taken to consume power wisely, an electronic device may unacceptably consume a significant portion of the limited battery capacity.

Electronic devices with wireless communications capabilities typically include amplifying circuits that are used to amplify radio-frequency signals prior to wireless transmission. For example, a radio-frequency power amplifier may receive input signals having an input power level and generate corresponding output signals having an output power level. The radio-frequency power amplifier receives a power supply voltage that powers the radio-frequency amplifier.

The power supply voltage provided to the radio-frequency power amplifier can be continuously adjusted based on the magnitude of the transmit signals that are amplified by the power amplifier in a process sometimes referred to as envelope tracking. When performing envelope tracking, overall power consumption is reduced in the device while providing radio-frequency signals over an antenna transmitter path to an antenna. However, when transmitting signals, a significant portion of the signals can be reflected by the antenna back onto the antenna transmitter path, thereby decreasing the stability of the amplifying circuits and consequently generating receiver channel noise and/or causing Adjacent Channel Leakage Ratio (ACLR) degradation. It would therefore be desirable to be able to provide wireless communications circuitry having improved envelope tracking capabilities.

SUMMARY

An electronic device may be provided with wireless communications circuitry, control circuitry, and sensor circuitry. The wireless communications circuitry may include transmitter circuitry, receiver circuitry, feedback receiver circuitry, and an antenna. The transmitter circuitry may transmit radio-frequency signals that are amplified by amplifier circuitry interposed between the transmitter circuitry and the antenna. The wireless communications circuitry may further include power supply circuitry configured to provide a bias voltage to the amplifier circuitry. Envelope mapping circuitry and envelope tracking circuitry in the power supply circuitry may adjust the bias voltage in real time.

In particular, the power supply circuitry may generate the bias voltage based on a mapping setting of the envelope mapping circuitry and based on an envelope signal associated with the transmitted radio-frequency signals. The power supply circuitry may further generate the bias voltage based on an additional mapping setting of the envelope mapping circuitry and based on the envelope signal. The mapping setting may include transfer functions for the envelope signal received at the envelope mapping circuitry, as an example.

The control circuitry may provide control signals to the power supply circuitry to generate the bias voltage based on a mapping setting of the envelope mapping circuitry. Sensor circuitry may generate sensor data and provide the sensor data to the control circuitry. The control circuitry may generate the control signals based on the generated sensor data. If desired, the sensor circuitry may include a directional coupler interposed between the amplifier circuitry and the antenna. The sensor data may include phase and magnitude information associated with forward and reflected portions of the transmitted radio-frequency signals. The control circuitry may adjust the envelope mapping setting based on the sensor data to mitigate current surges or other undesirable behavior in the amplifier circuitry caused by the reflected portion of the transmitted radio-frequency signals.

DETAILED DESCRIPTION

Figure 1:
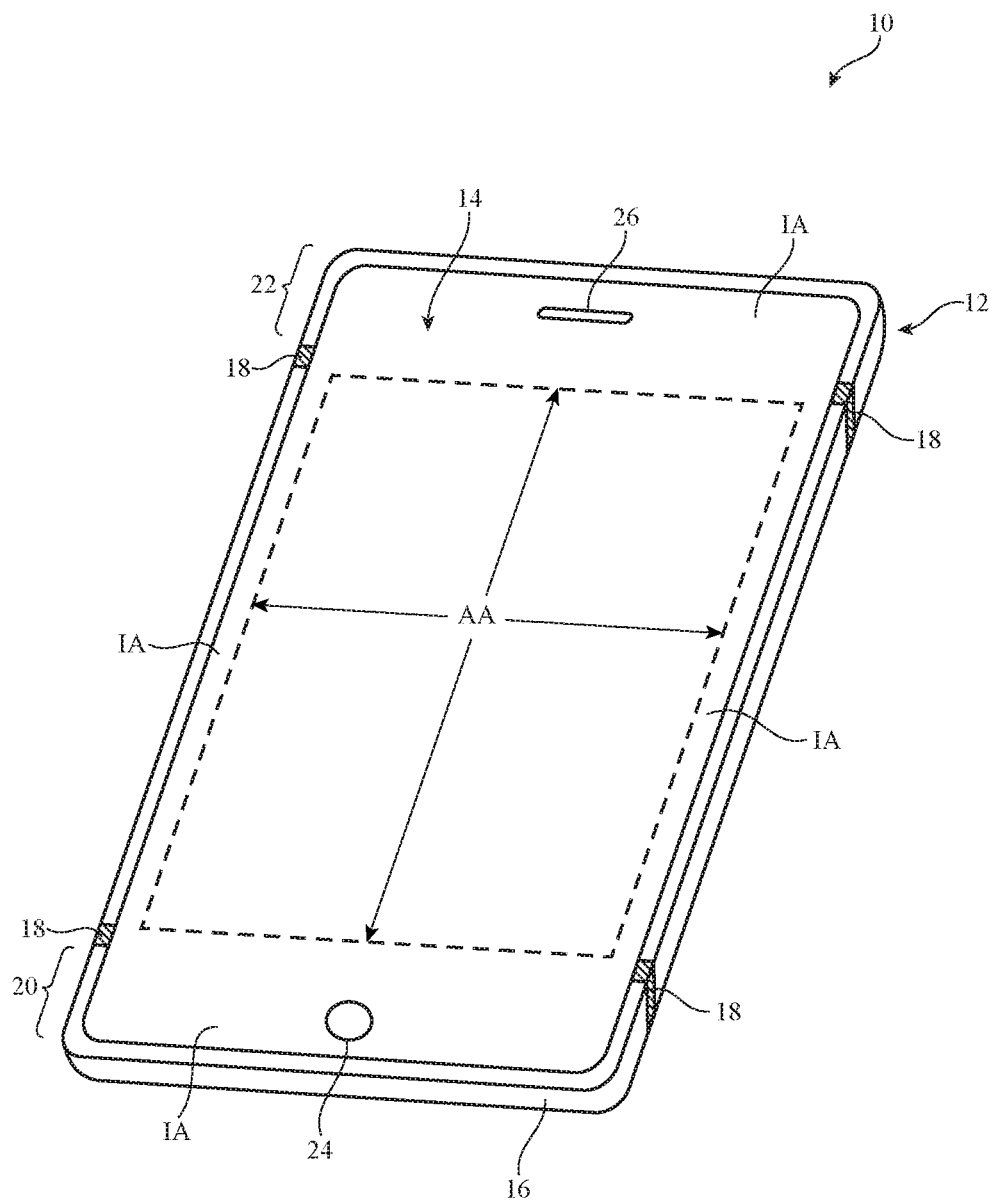
FIG. 1 is a perspective view of an illustrative electronic device in accordance with an embodiment.

Electronic devices such as electronic device 10 of FIG. 1 may be provided with wireless communications circuitry. The wireless communications circuitry may be used to support wireless communications in multiple wireless communications bands.

The wireless communications circuitry may include one or more antennas. The antennas of the wireless communications circuitry can include loop antennas, inverted-F antennas, strip antennas, planar inverted-F antennas, slot antennas, hybrid antennas that include antenna structures of more than one type, or other suitable antennas. Conductive structures for the antennas may, if desired, be formed from conductive electronic device structures.

The conductive electronic device structures may include conductive housing structures. The housing structures may include peripheral structures such as peripheral conductive structures that run around the periphery of an electronic device. The peripheral conductive structures may serve as a bezel for planar structures such as a display, may serve as sidewall structures for a device housing, may have portions that extend upwards from an integral planar rear housing (e.g., to form vertical planar sidewalls or curved sidewalls), and/or may form other housing structures.

Gaps may be formed in the peripheral conductive structures that device the peripheral conductive structures into peripheral segments. One or more of the segments may be used in forming one or more antennas for electronic device 10. Antennas may also be formed using an antenna ground plane formed from conductive housing structures such as metal housing midplate structures and other internal device structures. Rear housing wall structures may be used in forming antenna structures such as an antenna ground.

Electronic device 10 may be a portable electronic device or other suitable electronic device. For example, electronic device 10 may be a computing device such as a laptop computer, a computer monitor containing an embedded computer, a tablet computer, a somewhat smaller device such as a wrist-watch device, pedant device, headphone device, earpiece device, a virtual or augmented reality headset device, a device embedded in eyeglasses or equipment worn on a user's head, or other wearable or miniature device, a handheld device such as a cellular telephone, a media player, or other small portable device, a gaming device, a navigation device, an embedded system such as a system in which electronic equipment with a display is mounted in a kiosk or automobile, a wireless access point or base station (e.g., a wireless router or other equipment for routing communications between other wireless devices and a larger network such as the internet or a cellular telephone network), a keyboard, a gaming controller, a computer mouse, a mousepad, a trackpad or touchpad, a television, a set-top box, a desktop computer, a computer monitor into which a computer has been integrated, equipment that implements the functionality of two or more of these device, or other electronic equipment.

Device 10 may include a housing such as housing 12. Housing 12, which may sometimes be referred to as a case, may be formed of plastic, glass, ceramics, fiber composites, metal (e.g., stainless steel, aluminum, etc.), other suitable materials, or a combination of these materials. In some situations, parts of housing 12 may be formed from dielectric or other low-conductivity material. In other situations, housing 12 or at least some of the structures that make up housing 12 may be formed from metal elements.

Device 10 may, if desired, have a display such as display 14. The rear face of housing 12 may have a planar housing wall. The rear housing wall may be separate into first and second portions by a gap that is filled with plastic or other dielectric. Conductive structures may electrically couple the first and second portions together. Display 14 may be mounted on the opposing front face of device 10 from the rear housing wall. Display 14 may be a touch screen that incorporates capacitive touch electrodes or may be insensitive to touch.

Display 14 may include pixels formed from light-emitting diodes (LEDs), organic LEDs (OLEDs), plasma cells, electrowetting pixels, electrophoretic pixels, liquid crystal display (LCD) components, or other suitable pixel structures. A display cover layer such as a layer of clear glass or plastic may cover the surface of display 14 or the outermost layer of display 14 may be formed from a color filter layer, a thin-film transistor layer, or other display layer. Buttons such as button 24 may pass through openings in the cover layer. The cover layer may also have other openings such as an opening for speaker port 26.

Housing 12 may include peripheral housing structures such as structures 16. Structures 16 may run around the periphery of device 10 and display 14. In configurations in which device 10 and display 14 have a rectangular shape with four edges, structures 16 may be implemented using peripheral housing structures that have a rectangular ring shape with four corresponding edges (as an example). Peripheral structures 16 or part of peripheral structures 16 may serve as a bezel for display 14 (e.g., a cosmetic trim that surrounds all four sides of display 14 and/or that helps hold display 14 to device 10). Peripheral structures 16 may also, if desired, form sidewall structures for device 10 (e.g., by forming a metal band with vertical sidewalls, curved sidewalls, etc.).

Peripheral housing structures 16 may be formed of a conductive material such as metal and may therefore sometimes be referred to as peripheral conductive housing structures, conductive housing structures, peripheral metal structures, or a peripheral conductive housing member (as examples). Peripheral housing structures 16 may be formed from a metal such as stainless steel, aluminum, or other suitable materials. One, two, or more than two separate structures may be used in forming peripheral housing structures 16.

It is not necessary for peripheral housing structures 16 to have a uniform cross-section. For example, the top portion of peripheral housing structures 16 may, if desired, have an inwardly protruding lip that helps hold display 14 in place. The bottom portion of peripheral housing structures 16 may also have an enlarged lip (e.g., in the plane of the rear surface of device 10). Peripheral housing structures 16 may have substantially straight vertical sidewalls, may have sidewalls that are curved, or may have other suitable shapes. In some configurations (e.g., when peripheral housing structures 16 serve as a bezel for display 14), peripheral housing structures 16 may run around the lip of housing 12 (i.e., peripheral housing structures 16 may cover only the edge of housing 12 that surrounds display 14 and not the rest of the sidewalls of housing 12).

If desired, housing 12 may have a conductive rear surface. For example, housing 12 may be formed from a metal such as stainless steel or aluminum. The rear surface of housing 12 may lie in a plane that is parallel to display 14. In configurations for device 10 in which the rear surface of housing 12 is formed from metal, it may be desirable to form parts of peripheral conductive housing structures 16 as integral portions of the housing structures forming the rear surface of housing 12. For example, a rear housing wall of device 10 may be formed from a planar metal structure and portions of peripheral housing structures 16 on the sides of housing 12 may be formed as vertically extending integrated metal portions of the planar metal structure. Housing structures such as these may, if desired, be machined from a block of metal and/or may include multiple metal pieces that are assembled together to form housing 12. The planar rear wall of housing 12 may have one or more, two or more, or three or more portions.

Display 14 may have an array of pixels that form an active area AA that displays images for a user of device 10. An inactive border region such as inactive area IA may run along one or more of the peripheral edges of active area AA.

Display 14 may include conductive structures such as an array of capacitive electrodes for a touch sensor, conductive lines for addressing pixels, driver circuits, etc. Housing 12 may include internal conductive structures such as metal frame members and a planar conductive housing member (sometimes referred to as a midplate) that spans the walls of housing 12 (i.e., a substantially rectangular sheet formed from one or more parts that is welded or otherwise connected between opposing sides of member 16). Device 10 may also include conductive structures such as printed circuit boards, components mounted on printed circuit boards, and other internal conductive structures. These conductive structures, which may be used in forming a ground plane in device 10, may be located in the center of housing 12 and may extend under active AA of display 14.

In regions 22 and 20, openings may be formed within the conductive structures of device 10 (e.g., between peripheral conductive housing structures 16 and opposing conductive ground structures such as conductive housing midplate or rear housing wall structures, a printed circuit board, and conductive electrical components in display 14 and device 10). These openings, which may sometimes be referred to as gaps, may be filled with air, plastic, and other dielectrics and may be used in forming slot antenna resonating elements for one or more antennas in device 10.

Conductive housing structures and other conductive structures in device 10 such as a midplate, traces on a printed circuit board, display 14, and conductive electronic components may serve as a ground plane for the antennas in device 10. The openings in regions 20 and 22 may serve as slots in open or closed slot antennas, may serve as a central dielectric region that is surrounded by a conductive path of materials in a loop antenna, may serve as a space that separates an antenna resonating element such as a strip antenna resonating element or an inverted-F antenna resonating element from the ground plane, may contribute to the performance of a parasitic antenna resonating element, or may otherwise serve as part of antenna structures formed in regions 20 and 22. If desired, the ground plane that is under active area AA of display 14 and/or other metal structures in device 10 may have portions that extend into parts of the ends of device 10 (e.g., the ground may extend towards the dielectric-filled openings in regions 20 and 22), whereby narrowing the slots in regions 20 and 22. In configurations for device 10 with narrow U-shaped openings or other openings that run along the edges of device 10, the ground plane of device 10 can be enlarged to accommodate additional electrical components (integrated circuits, sensors, etc.)

In general, device 10 may include any suitable number of antennas (e.g., one or more, two or more, three or more, four or more, etc.). The antennas in device 10 may be located at opposing first and second ends of an elongated device housing (e.g., at ends 20 and 22 of device 10 of FIG. 1), along one or more edges of a device housing, in the center of a device housing, in other suitable locations, or in one or more of these locations. The arrangement of FIG. 1 is merely illustrative.

Portions of peripheral housing structures 16 may be provided with peripheral gap structures. For example, peripheral conductive housing structures 16 may be provided with one or more gaps such as gaps 18, as shown in FIG. 1. The gaps in peripheral housing structures 16 may be filled with dielectric such as polymer, ceramic glass, air, other dielectric materials, or combinations of these materials. Gaps 18 may divide peripheral housing structures 16 into one or more peripheral conductive segments. There may be, for example, two peripheral conductive segments in peripheral housing structures 16 (e.g., in an arrangement with two of gaps 18), three peripheral conductive segments (e.g., in an arrangement with three of gaps 18), four peripheral conductive segments (e.g., in an arrangement with four gaps 18), etc. The segments of peripheral conductive housing structures 16 that are formed in this way may form parts of antennas in device 10.

If desired, openings in housing 12 such as grooves that extend partway or completely through housing 12 may extend across the width of the rear wall of housing 12 and may penetrate through the rear wall of housing 12 to divide the rear wall into different portions. These grooves may also extend into peripheral housing structures 16 and may form antenna slots, gaps 18, and other structures in device 10. Polymer or other dielectric may fill these grooves and other housing openings. In some situations, housing openings that form antenna slots and other structures may be filled with a dielectric such as air.

In a typical scenario, device 10 may have upper and lower antennas (as an example). An upper antenna may, for example, be formed at the upper end of device 10 in region 22. A lower antenna may, for example, be formed at the lower end of device 10 in region 20. The antennas may be used separately to cover identical communications bands, overlapping communications bands, or separate communications bands. The antennas may be used to implement an antenna diversity scheme or a multiple-input-multiple-output (MIMO) antenna scheme.

Antennas in device 10 may be used to support any communications bands of interest. For example, device 10 may include antenna structures for supporting local area network communications, voice and data cellular telephone communications, global positioning systems (GPS) communications or other satellite navigation system communications, Bluetooth® communications, etc.

Figure 2:
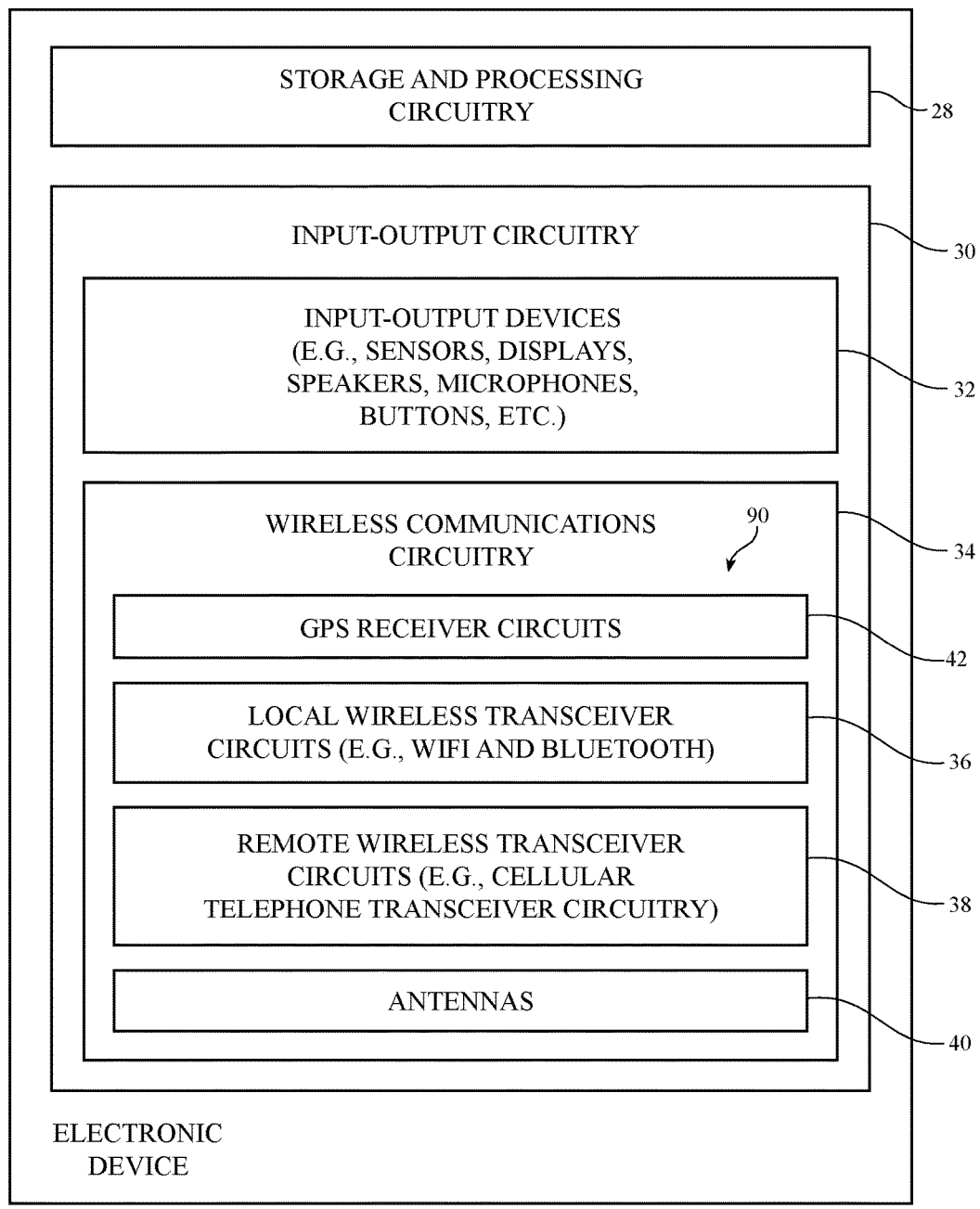
FIG. 2 is a schematic diagram of illustrative circuitry in an electronic device in accordance with an embodiment.

A schematic diagram showing illustrative components that may be used in device 10 of FIG. 1 is shown in FIG. 2. As shown in FIG. 2, device 10 may include control circuitry such as storage and processing circuitry 28. Storage processing circuitry 28 may include storage such as hard disk drive storage, nonvolatile memory (e.g., flash memory or other electrically-programmable-read-only memory configured to form a solid-state drive), volatile memory (e.g., static or dynamic random-access-memory), etc. Processing circuitry in storage and processing circuitry 28 may be used to control the operation of device 10. This processing circuitry may be based on one or more microprocessors, microcontrollers, digital signal processors, application specific integrated circuits, etc.

Storage and processing circuitry 28 may be used to run software on device 10, such as internet browsing applications, void-over-internet-protocol (VOIP) telephone call applications, email applications, media playback applications, operating system functions, etc. To support interactions with external equipment, storage and processing circuitry 28 may be used in implementing communications protocols. Communications protocols that may be implemented using storage and processing circuitry 28 may include internet protocols, wireless local area network protocols (e.g., IEEE 802.11 protocols—sometimes referred to as WiFi®), protocols for other short-range wireless communications links such as the Bluetooth® protocol, cellular telephone protocols, multiple-input-multiple-output (MIMO) protocols, antenna diversity protocols, etc.

Input-output circuitry 30 may include input-output devices 32. Input-output devices 32 may be used to allow data to be supplied to device 10 and to allow data to be provided from device 10 to external devices. Input-output devices 32 may include user interface devices, data port devices, and other input-output components. For example, input-output devices 32 may include touch screens, displays without touch sensor capabilities, buttons, joysticks, scrolling wheels, touch pads, key pads, keyboards, microphones, cameras, speakers, status indicators, light sources, audio jacks and other audio portion components, digital data port devices, light sensors, motion sensors (e.g., accelerometers), capacitance sensors, proximity sensors, fingerprint sensors (e.g., a fingerprint sensors integrated with a button such as button 24 of FIG. 1 or a fingerprint sensor that takes the place of button 24), temperature sensors, etc.

Input-output circuitry 30 may include wireless communications circuitry 34 for communication wirelessly with external equipment. Wireless communications circuitry 34 may include radio-frequency (RF) transceiver circuitry formed from one or more integrated circuits, power amplifier circuitry, low-noise input amplifiers, passive RF components, one or more antennas, transmission lines, and other circuitry for handling RF wireless signals. Wireless signals can also be sent using light (e.g., using infrared communications).

Wireless communications circuitry 34 may include radio-frequency transceiver circuitry 90 for handling various radio-frequency communications bands. For example, circuitry 34 may include transceiver circuitry 36, 38, and 42. Transceiver circuitry 36 may handle 2.4 GHz and 5 GHz bands for WiFi® (IEEE 802.11) communications and may handle the 2.4 GHz Bluetooth® communications band. Circuitry 34 may use cellular telephone transceiver circuitry 38 for handling wireless communications in frequency ranges such as a low communications band from 700 to 960 MHz, a low-midband from 1400 to 1520 MHz, a midband from 1710 to 2170 MHz, and a high band from 2300 to 2700 MHz or other communications bands between 700 MHz and 4000 MHz or other suitable frequencies (as examples). Circuitry 38 may handle voice data and non-voice data. Wireless communications circuitry 34 may include circuitry for other short-range and long-range wireless links if desired. For example, wireless communications circuitry 34 may include 60 GHz transceiver circuitry, circuitry for receiving television and radio signals, paging system transceivers, near-field communications (NFC) circuitry, etc. Wireless communications circuitry 34 may include global positioning system (GPS) receiver equipment such as GPS receiver circuitry 42 for receiving GPS signals at 1575 MHz or for handling other satellite positioning data. In WiFi® and Bluetooth® links and other short-range wireless links, wireless signals are typically used to convey data over tens or hundreds of feet. In cellular telephone links and other long-range links, wireless signals are typically used to convey data over thousands of feed or miles.

Wireless communications circuitry 34 may include antennas 40. Antennas 40 may be formed using any suitable antenna types. For example, antennas 40 may include antennas with resonating elements that are formed form loop antenna structures, patch antenna structures, inverted-F antenna structures, slot antenna structures, planar inverted-F antenna structures, helical antenna structures, monopole antenna structures, dipole antenna structures, hybrid of these designs, etc. Different types of antennas may be used for different bands and combination of bands. For example, one type of antenna may be used in forming a local wireless link antenna and another type of antenna may be used in forming a remote wireless link antenna.

Transceiver circuitry 90 in wireless circuitry 34 may be coupled to antenna structures 40 using paths (sometimes referred to herein as antenna transmitter paths and antenna receiver paths). The paths may include one or more transmission lines each having a positive signal conductor and a ground signal conductor. As examples, the positive signal conductor and the ground signal conductor may form parts of a coaxial cable or a microstrip transmission line. A matching network formed from components such as inductors, resistors, and capacitors may be used in matching the impedance of antenna(s) 40 to the impedance of the transmission line. Matching network components may be provided as discrete components (e.g., surface mount technology components) or may be formed from housing structures, printed circuit board structures, traces on plastic supports, etc. Components such as these may also be used in forming filter circuitry in antenna(s) 40 and may be tunable and/or fixed components. Wireless circuitry 34 may be coupled to control circuitry 28. Control circuitry 28 may be coupled to input-output devices 32. Input-output devices 32 may supply output from device 10 and may receive input from sources that are external to device 10.

To minimize power consumption of device 10, storage and processing circuitry 28 may be used in implementing power management functions for device 10. For example, storage and processing circuitry 28 may be used to adjust the power supply voltages (sometimes referred to herein as bias voltages) that are used in powering the radio-frequency power amplifier circuitry. Whenever possible, these power amplifier bias voltages may be reduced to conserve power. If desired, storage and processing circuitry 28 may also be used to adjust the gain state of radio-frequency power amplifier circuitry on device 10 and may be used in adjusting the gain of a variable gain amplifier (VGA) that feeds output signals to the power amplifier circuitry. These adjustments may be made automatically in real time. For example, code may be stored in storage and processing circuitry 28 that configures storage and processing circuitry 28 to implement a control scheme in which operating settings are adjusted in accordance with calibration data to satisfy desired performance criteria such as desired transmit power levels, receive band noise levels, and adjacent channel leakage values while minimizing power consumption.

In some circuit architectures, a transceiver circuit (more specifically, a transmitter circuit) in wireless communications circuitry 34 may supply radio-frequency signals to the input of a power amplifier for transmission over an antenna. The power at which the power amplifier outputs radio-frequency signals establishes an output power level for the power amplifier. The power at which the transceiver circuit provides radio-frequency signals to the power amplifier establishes an input power level for the power amplifier. The input power level may correspond to a voltage magnitude (amplitude) of the transmit signals at the input of the power amplifier. The output power level may correspond to a voltage magnitude of the transmit signals at the output of the power amplifier. Adjustments to the power amplifier may be made to adjust the power of radio-frequency signals transmitted by device 10 (e.g., to ensure a suitable wireless link is established and maintained with external wireless communications equipment or devices at various distances with respect to device 10).

Figure 3:
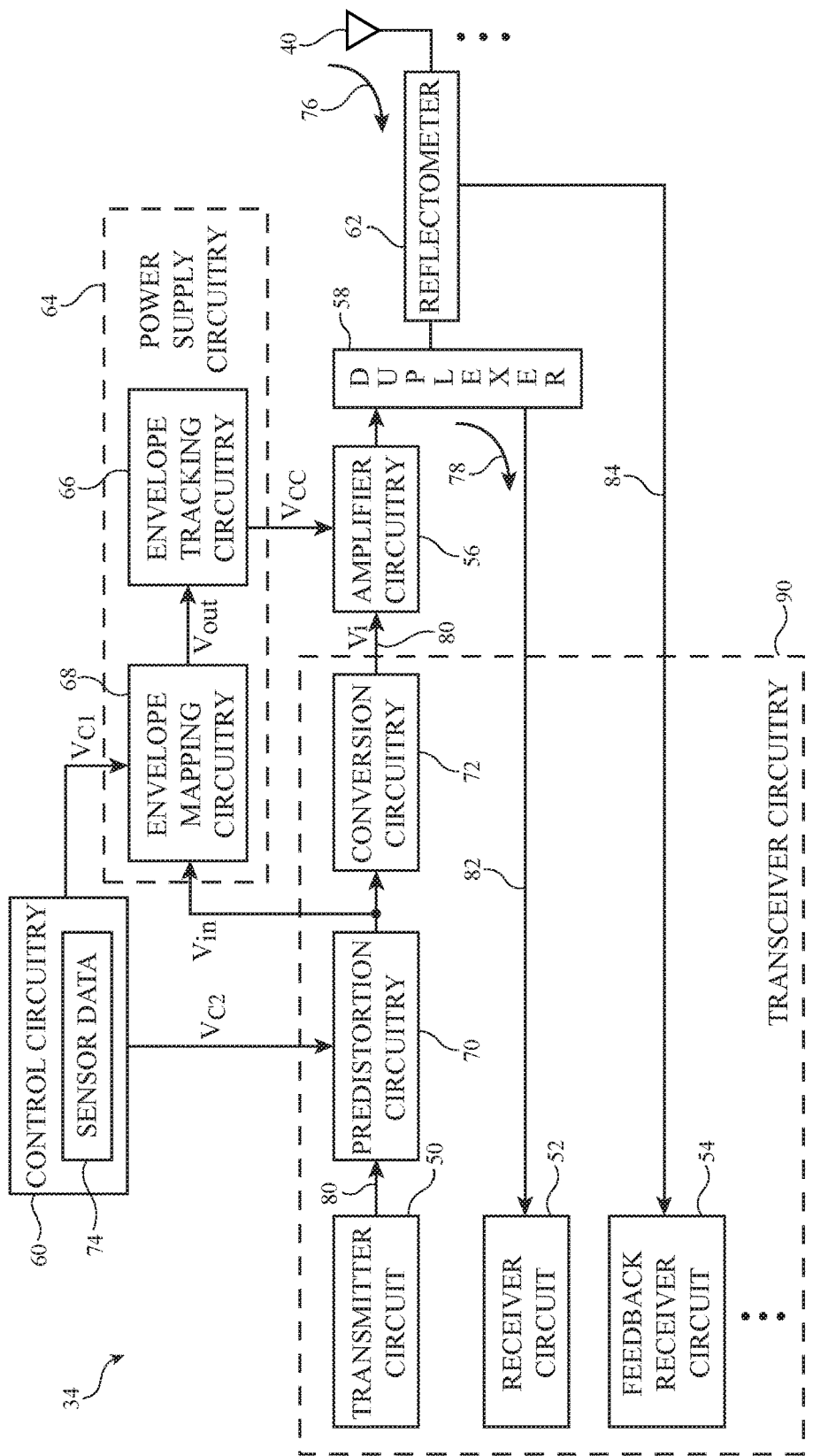
FIG. 3 is a block diagram of illustrative wireless communications circuitry having power supply circuitry that provides an adjustable power supply voltage to amplifier circuitry in accordance with an embodiment.

In particular, FIG. 3 is a diagram showing how wireless communications circuitry 34 may be provided with amplifier circuitry and corresponding power supply circuitry. As shown in FIG. 3, transceiver circuitry 90 in wireless communications circuitry 34 may include one or more transmitter circuits such as transmitter 50, one or more receiver circuits such as receiver 52, and one or more feedback receiver circuits such as feedback receiver 54. Transmitter circuit 50 may be coupled to antenna 40 via transmit path 80 (e.g., a transmission line path through which radio-frequency transmit signals may be provided to antenna 40 by transmitter circuit 50).

Amplifier circuitry such as amplifier circuitry 56 may be interposed between transmitter 50 and antenna 40. Amplifier circuitry 56 may modify the signals generated by transmitter 50 prior to transmitting the signals using antenna 40 (e.g., circuitry 56 may amplify the magnitude or power of the signals generated by transmitter 50). Amplifier circuitry 56 may include a radio-frequency power amplifier and may therefore sometimes be referred to herein as power amplifier 56 or radio-frequency power amplifier 56. However, in general, amplifier circuitry 56 may include any desired combination of gain amplifiers, power amplifiers, voltage amplifiers, and/or other amplifier circuits. Power amplifier 56 may have corresponding input and output terminals. Power amplifier 56 may amplify a radio-frequency signal received at its input terminal to generate a corresponding power-amplified output signal at its output terminal.

Figure 4:
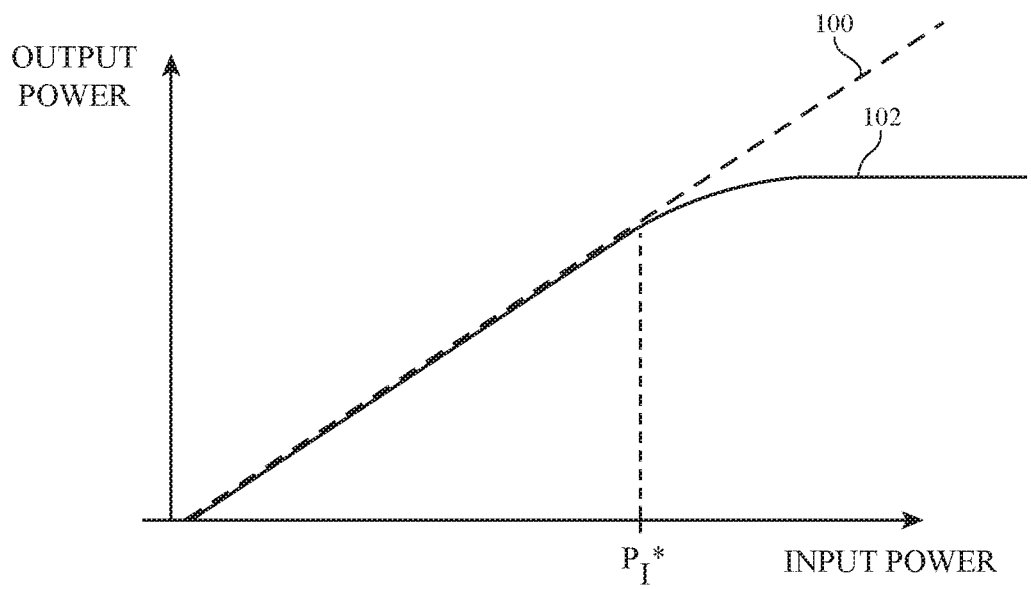
FIG. 4 is an illustrative diagram plotting output power level versus input power level of amplifier circuitry in accordance with an embodiment.

Ideally, power amplifier 56 exhibits a perfectly linear power response. However, in practice, power amplifier 56 may exhibit non-ideal behavior (e.g., may exhibit a non-linear input power to output power response). FIG. 4 plots output power level versus input power level for an illustrative radio-frequency power amplifier such as power amplifier 56. Response line 100 may represent an ideal power characteristic, whereas curve 102 may represent an actual power characteristic of the power amplifier in practice. As shown in FIG. 4, line 100 may have a constant slope across all input power levels (i.e., any increase in input power results in a corresponding increase in output power by a predetermined amount).

It is, however, challenging to manufacture power amplifiers that exhibit perfectly linear power transfer characteristics. Linear power amplifiers may be particularly inefficient, thereby increasing current drain and decreasing device battery life. In practice, increases in input power levels may not always increase the output power by the predetermined amount. As shown by curve 102 in FIG. 4, the slope of curve 102 may deviate from the desired slope of line 100 after a certain power level PI*. This deviation may result in a reduction in the gain provided by the power amplifier at input power levels greater than PI* and may therefore sometimes be referred to as gain compression. In general, radio-frequency power amplifier circuity 56 in device 10 may exhibit gain compression and/or may deviate from the ideal transfer characteristic in any other way. With amplitude modulated signals, this nonlinearity may degrade signal quality metrics such as Error Vector Magnitude (EVM), or may generate out of band noise due to Intermodulation Distortion (IMD) products (e.g., degrade ACLR).

Returning to FIG. 3, predistortion circuitry 70 may be interposed between transmitter circuit 50 and the input of power amplifier circuitry 56 along transmit path 80 to mitigate gain compression associated with power amplifier circuitry 56. Predistortion circuitry 70 may receive a transmit signal from transmitter circuit 50 and may adjust the transmit signal to compensate for power amplifier gain compression by amplifier circuitry 56. For example, predistortion circuitry 70 may receive control signals such as digital predistortion (DPD) coefficients from control circuitry (e.g., processing circuitry 28) that determine the transfer characteristics of predistortion circuitry 70. The control signals or coefficients may convey information about the input power PI* above which gain compression occurs, the extent of gain compression, the transfer function of the gain compression, any distortion characteristics of amplifier circuitry 56, and/or any distortion properties of any downstream circuitry, as examples.

If desired, predistortion circuitry 70 may introduce distortion onto the transmit signal to perform gain expansion (e.g., to compensate for power amplifier gain compression). Predistortion circuitry 70 may introduce distortion onto the transmit signal by applying selected digital predistortion (DPD) coefficients to the transmit signal, for example. If desired, the DPD coefficients may be obtained during device testing operations or calibration operations (e.g., prior to use of device 10 by an end user). Predistortion circuitry 70 may sometimes be referred to herein as digital predistortion (DPD) circuitry 70. If desired, DPD circuitry 70 may include an amplitude to amplitude modulation digital predistortion circuit (AM/AM DPD) portion and an amplitude to phase modulation digital predistortion circuit (AM/PM DPD) portion that respectively receive magnitude and phase portions of transmit signals generated by transmitter 50.

Figure 5:
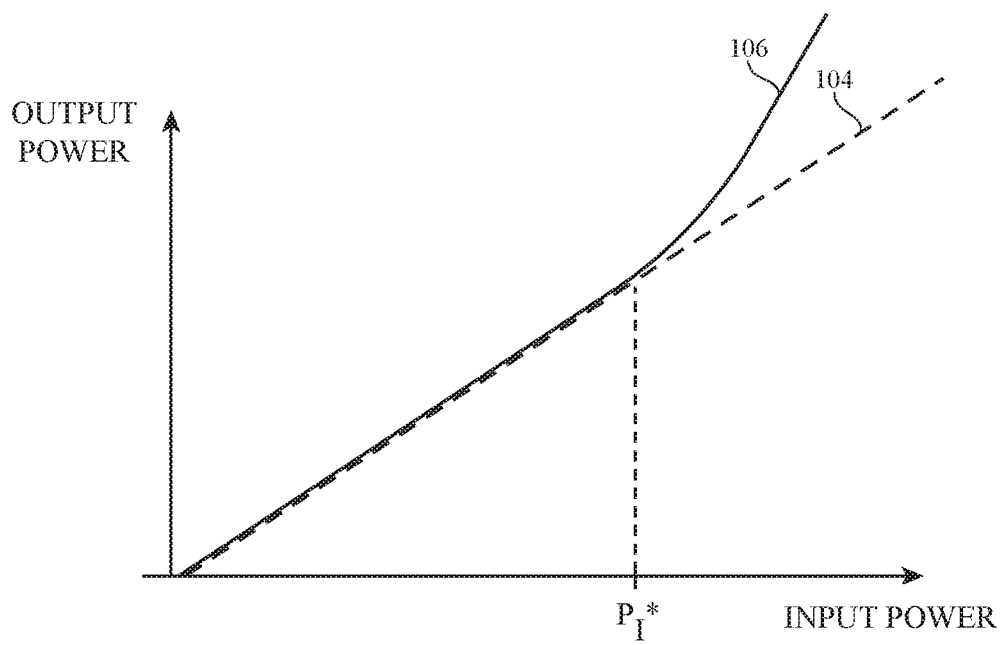
FIG. 5 is an illustrative diagram plotting output power level versus input power level of predistortion circuitry in accordance with an embodiment.

By applying the DPD coefficients to the transmit signal, predistortion circuitry 70 may introduce signal compensations (distortions) that account or correct for undesired deviation(s) from the ideal power transfer characteristic (e.g., to counteract any undesirable non-linear behavior associated with any power amplifiers in amplifier circuitry 56). FIG. 5 plots output power level versus input power level for exemplary predistortion circuitry such as predistortion circuitry 70. Line 104 may exhibit a constant slope of one, whereas curve 106 may exhibit the actual power characteristic of predistortion circuitry 70. For all signals that are received by predistortion circuitry 70 and that have power levels less than or equal to PI*, these signals may be passed through to the output of the predistortion circuit without any amplification or attenuation. For all signals that are received by predistortion circuit 70 and that have power levels greater than PI*, these signals may be provided with an appropriate amount of gain to compensate for the gain compression associated with power amplifier 56 as described in connection with FIG. 4. Predistortion circuitry 70 may generate response 106 using predistortion coefficient values received from control circuitry (e.g., processing circuitry 28 in FIG. 2), for example.

Curve 106 of FIG. 5 is merely illustrative. In general, predistortion circuitry 70 may exhibit a power transfer curve having an inverse relationship with respect to the input-output transfer characteristic associated with a corresponding power amplifier (e.g., a positive deviation in curve 102 from line 100 at a given first input power level may be accompanied by a negative deviation in curve 106 from line 104 at the given first input power level, whereas a negative deviation in curve 102 from line 100 at a given second input power level may be accompanied by a positive deviation in curve 106 from line 104 at the given second input power level). Control circuitry 28 may generate and provide control signals (e.g., control signals Vc2 in FIG. 3) to predistortion circuitry 70 so that predistortion circuitry 70 exhibits response 106 for a given transmit signal. The control signals may be generated based on the performance characteristics of the corresponding power amplifier (e.g., based on the linearity of the power transfer function of the corresponding power amplifier, based on the calibration data associated testing the corresponding power amplifier, etc.). Control signals Vc2 may include selected DPD coefficients if desired.

Returning to FIG. 3, conversion circuitry 72 may be interposed between digital predistortion circuitry 70 and power amplifier 56. Conversion circuitry 72 may include a Digital-to-Analog converter (DAC), a Polar-to-Cartesian converter, a Coordinate Rotation Digital Computer (CORDIC) circuit, or any other desired conversion circuits. Conversion circuitry 72 may receive the (distorted) transmit signal from predistortion circuitry 70 and may convert the transmit signal into an analog transmit signal. Downstream power amplifier 56 may receive the analog transmit signal and amplify the analog transmit signal. Antenna 40 may subsequently transmit the amplified analog transmit signal.

Power amplifier 56 may receive a power supply voltage Vcc from power supply circuitry 64 that enables power amplifier 56 to perform power amplification operations. If desired, power supply circuitry 64 may supply a continuously varied power supply voltage Vcc (sometimes referred to herein as power supply signal Vcc, bias signal Vcc, or bias voltage Vcc) to power amplifier 56 and may therefore sometimes be referred to herein as an adjustable power supply circuitry 64. Alternatively, power supply circuitry 64 may be controlled to provide a constant supply voltage.

If desired, power supply circuitry 64 may include envelope tracking circuitry such as envelope tracking circuitry 66. Envelope tracking circuitry 66 may enable power supply circuitry 64 to provide an optimal time-varied power supply voltage Vcc to amplifier circuitry 56, thereby reducing power consumption of communications circuitry 34 while meeting performance requirements (i.e., circuitry 66 may perform envelope tracking operations to reduce power consumption). Envelope tracking circuitry 66 may continuously adjust bias voltage Vcc over time, if desired. In particular, envelope tracking circuitry 66 may adjust bias voltage Vcc based on the magnitude of a corresponding transmit signal transmitted along path 80. For example, envelope tracking circuitry 66 may receive a modulation "envelope" of the transmit signal (e.g., an envelope provided by modulating the transmit signals using a baseband processor). Based on the modulation envelope of the transmit signal, envelope tracking circuitry 66 may generate a corresponding modulated power supply signal (e.g., power supply signal Vcc). At a given time, modulated power supply signal Vcc may track the curve of the modulation envelope in a suitable manner.

As an example, power supply signal Vcc may maintain a fixed voltage difference from the envelope of the transmit signal, may maintain a variable voltage difference proportional to the voltage amplitude of the envelope of the transmit signal, or may track the envelope of the transmit signal in any other way. If desired, envelope tracking circuitry 66 may use any combination of tracking configurations during different time periods to reduce power consumption of communications circuitry 34 appropriately (e.g., envelope tracking circuitry 66 may generated a modulated power supply signal that has a fixed voltage difference from the envelope of the transmit signal during a first time period and that has a variable voltage difference from the envelope of the transmit signal during a second time period).

Figure 6:
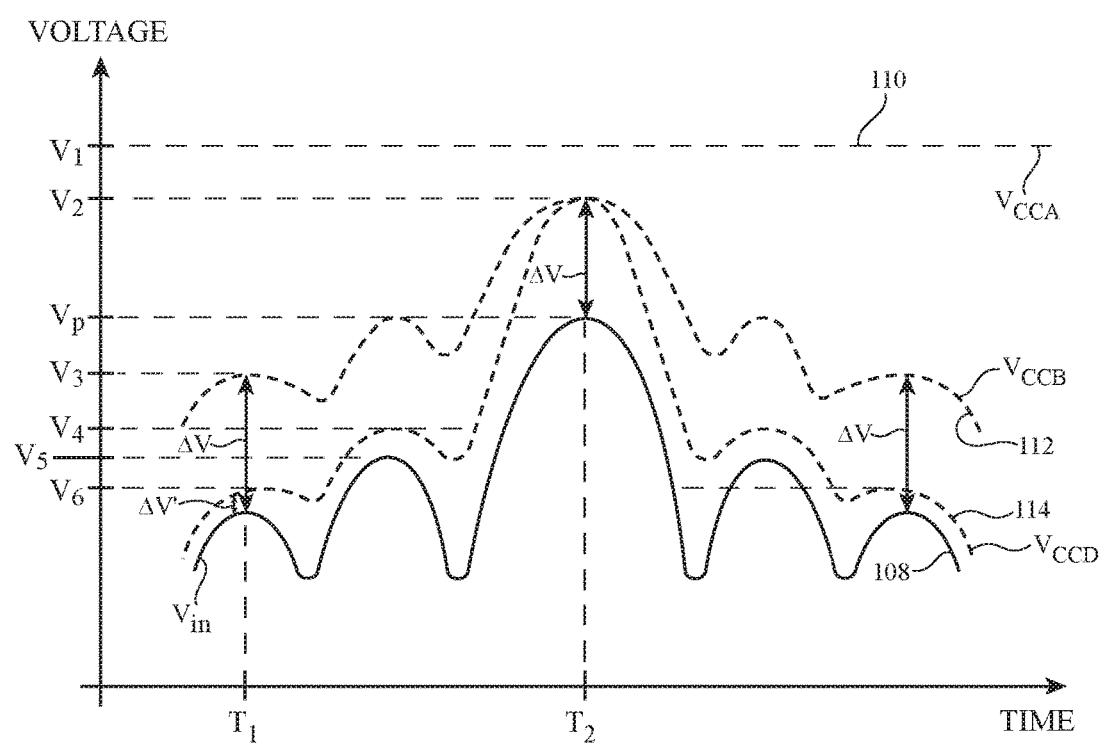
FIG. 6 is an illustrative diagram showing how power amplifier supply voltage may be continuously adjusted to reduce power consumption in accordance with an embodiment.

FIG. 6 is an illustrative graph showing how envelope tracking circuitry 66 in power supply circuitry 64 of device 10 may continuously adjust power supply signal Vcc based on the corresponding transmit signal. In the graph of FIG. 6, voltages have been plotted as a function of time. Curve 108 may, for example, represent the modulation "envelope" (see, e.g., signal Vin of FIG. 3). of the transmit signal. The modulation envelope 108 of the transmit signal may sometimes be referred to herein as modulation envelope signal Vin or envelope signal Vin. The transmit signal as received by power amplifier 56 may sometimes be referred to herein as transmit signal Vi. Signals Vcc, Vin, and Vi may each have a corresponding magnitude (i.e., voltage or voltage magnitude) that varies over time. In order for power amplifier 56 to operate properly without generating undesired frequency harmonics of the transmit signals or other adjacent channel leakage ratio (ACLR) violations, bias voltage Vcc provided to power amplifier 56 should be greater than the voltage represented by curve 108 during transmission of the transmit signal by antenna 40.

Dashed line 110 illustrates a bias voltage VccA that may be provided to amplifier 56 without using envelope tracking (e.g., a constant bias voltage that is not adjusted based on the magnitude of the input transmit signal). In this scenario, constant bias voltage VccA has a magnitude that is greater than peak magnitude Vp of envelope curve 108. This may ensure that bias voltage Vcc is always greater than the magnitude of modulation envelope signal Vin so that no undesired frequency harmonics or other ACLR performance violations are generated by amplifier 56. However, device 10 may consume excessive power when using bias voltage VccA, since signal 108 often has a magnitude that is significantly less than peak voltage Vp and that does not require such a high bias voltage (e.g., at voltage level V1) to operate without generating radio-frequency performance violations. Power supply circuitry 64 may perform envelope tracking (using envelope tracking circuitry 66) to reduce overall power consumption by wireless communications circuitry 34.

Curve 112 illustrates a bias voltage VccB that may be provided in real time by envelope tracking circuitry 66 to amplifier circuitry 56 (e.g., by adjusting the magnitude of bias voltage Vcc over time based on the magnitude of envelope signal Vin). In this example, bias voltage VccB follows the magnitude of curve 108 such that bias voltage VccB always has a magnitude that is a fixed margin ΔV greater than curve 108 regardless of the magnitude of curve 108 (e.g., bias voltage VccB is greater than the relatively high magnitude Vp of envelope signal Vin at time T2 by margin ΔV, is greater than the relatively low magnitude of envelope signal Vin at time T1 by margin ΔV, etc.). In this way, overall power consumption in device 10 may be reduced relative to scenarios where constant bias voltage VccA is used.

The examples described above in connection with FIG. 6 are merely illustrative. Bias voltage signals may have any desired magnitude as a function of time (e.g., depending on what settings are used for envelope tracking circuitry 66). For example, FIG. 6 also shows bias voltage VccD associated with curve 114. Bias voltage VccD may allow device 10 to further reduce power consumption by providing bias signals that are greater than the transmit voltage level by different voltage margins over time (e.g., for different input voltages in signal Vi) without sacrificing the spectral performance of amplifier circuitry 56. Because a fixed margin ΔV may not be needed to ensure adequate linearity and spectral performance for low magnitudes of envelope signal Vin, bias voltage VccD may have lower magnitude relative to bias voltage VccB for relatively low voltages of envelope signal Vin and may thereby further reduce power consumption by device 10 relative to scenarios where bias voltage VccB is used (e.g., without sacrificing the radio-frequency performance of device 10). In other words, if desired, bias voltages Vcc may be greater than modulation envelope signal Vin by different voltage margins at different times (e.g., for different input voltages), thereby allowing for reduced power consumption relative to scenarios where bias voltage Vcc is always greater than input voltage magnitudes by a fixed voltage margin.

Returning to FIG. 3, receiver circuit 52 may be coupled to antenna 40 via receive path 82 (e.g., a transmission line path through which incoming radio-frequency signals may be provided from antenna 40 to receiver circuit 52). If desired, different portions of transceiver circuitry 90 may be formed on any combination of one or more integrated circuits, packages, modules, substrates, printed circuit substrates, etc. As examples, transmitter 50, receiver 52, feedback receiver circuit 54 may be formed on the same integrated circuit, on distinct and separate integrated circuits disposed on a single shared substrate, on separate integrated circuits disposed on separate substrates, etc. Amplifier circuitry 56, duplexer 58, and/or reflectometer 62 may be formed on the same substrate as one or more transceivers (e.g., transmitter circuits, receiver circuits, etc.) in transceiver circuitry 90 if desired.

If desired, transmitters and receivers in transceiver circuitry 90 may respectively transmit and receive signals over different antennas or may convey signals using a single shared antenna (e.g., transmitter 50 and receiver 52 may both operate using antenna 40). In this arrangement, a filter such as duplexer 58 may couple transmitter 50 and receiver 52 to antenna 40. Duplexer 58 may be a three-port filter that has a first port coupled to transmitter 50, a second port coupled to receiver 52, and a third port coupled to antenna 40. Duplexer 58 may be formed from passive filter circuitry that provides relatively high isolation between the first and second ports, for example.

Antennas such as antenna 40 may be affected by the presence of nearby objects. For example, an antenna may exhibit an expected response when device 10 is operated in free space in the absence of nearby external objects, but may exhibit a different response when device 10 is operated in the presence of an external object. External objects may include a user's body (e.g., a user's head, leg, hand, or other body part), may include a table or other inanimate object on which device 10 is resting, may include dielectric objects, may include a user's clothing, may include conductive objects, and/or may include other objects that affect wireless performance (e.g., by loading antenna 40 and thereby affecting antenna impedance for antenna 40).

If desired, impedance matching circuitry may be interposed between duplexer 58 and antenna 40. The impedance matching circuitry may ensure that antenna 40 is impedance matched to transmission line structures in wireless circuitry 34. However, the presence of different external objects in the vicinity of antenna 40 may alter the impedance of antenna 40 such that antenna 40 is no longer impedance matched to the transmission line structures. In this scenario, a portion of the radio-frequency signals that are transmitted by amplifier 56 may be reflected off of antenna 40 (e.g., due to the impedance discontinuity between antenna 40 and the transmission line structures in circuitry 34) and back towards duplexer 58 (as shown by arrow 76). Duplexer 58 may impose a time delay (e.g., a delay of 50-500 ns) onto reflected signal 76 in reaching the output of power amplifier 56. This is especially true if acoustic filters such as Surface Acoustic Wave (SAW) or Bulk Acoustic Wave (BAW) filters are used. If care is not taken, an amplitude peak of reflected signal 76 may reach the output of power amplifier 56 at a time when supply voltage Vcc for power amplifier 56 is relatively low, causing current in power amplifier 56 to surge (e.g., reflected signal 76 may reduce the base-collector voltage of power amplifier 56 to negative values) or causing other undesirable amplifier behavior, thereby leading to amplifier instability. This amplifier instability may introduce a signal ringing between amplifier circuitry 56 and duplexer 58, which may generate significant receiver channel noise onto receive path 82 (e.g., as shown by arrow 78) and may degrade the sensitivity of receiver 52. Furthermore, reflected signal 76 reaching the output of amplifier 56 may cause impedance and/or phase dispersion, resulting in ACLR degradation.

In order to mitigate this reduction in receiver sensitivity and/or ACLR degradation, power supply circuitry 64 may include envelope mapping circuitry 68 coupled to the input of envelope tracking circuitry 66. Envelope mapping circuitry 68 may receive modulation envelope signal Vin from predistortion circuitry 70 and may generate a corresponding modified (e.g., mapped) modulation envelope signal (e.g., modified modulation envelope signal Vout). Envelope tracking circuitry 66 may use modified modulation envelope signal Vout to provide bias voltage Vcc to power amplifier 56. For example, envelope tracking circuitry 66 may include an amplifier that amplifies signal Vout to produce bias voltage Vcc.

Envelope mapping circuitry 68 may store one or more settings. For example, the settings may include different envelope mapping settings that are used in modifying envelope signal Vin to generate modified envelope signal Vout. Each envelope mapping setting may map each possible magnitude of envelope signal Vin to a corresponding magnitude of output signal Vout (e.g., the magnitude of Vout over time may be determined by comparing the magnitude of Vin over time to a particular envelope mapping setting, where the envelope mapping settings provide different one-to-one mappings of the magnitudes of Vin to the magnitudes of Vout). In other words, each envelope mapping setting may be a respective transfer function for mapping circuitry 68 that receives as an input signal Vin and generates as an output signal Vout over time. The envelope mapping settings may sometimes be referred to herein as transfer characteristics, shaping characteristics, transfer functions, shaping functions, mapping functions, mapping characteristics, envelope mappings, mapping functions, or mapping curves. By selecting the appropriate mapping setting, bias voltage Vcc may track the magnitude of transmit signal Vi (and the corresponding envelope signal Vin) in different manners. For example, a first mapping setting (first transfer function) may produce curve 110, a second mapping setting (transfer function) may produce curve 112, and a third mapping setting (transfer function) may produce curve 114 of FIG. 6.

The particular mapping setting that is used may be selected by control circuitry 60 (e.g., using control signal Vc1). Control circuitry 60 may include storage and processing circuitry 28 of FIG. 2 and/or any other desired control circuitry in device 10. Control circuitry 60 may select the particular mapping setting to use based on sensor data, information about tasks or operations that are being performed by device 10, and/or any other desired information. Control circuitry 60 may select a mapping setting that optimizes the radio-frequency performance of circuitry 34 in real time. For example, some mapping settings may allow wireless circuitry 34 to optimize power consumption without sacrificing performance while device 10 is operated in a free space environment. However, as the loading conditions on antenna 40 change over time (e.g., due to the presence of external objects in the vicinity of antenna 40), amplifier instability and a corresponding reduction in receiver sensitivity and/or ACLR may be induced when operated using those (free space) mapping settings (e.g., due to the delayed reflected signal 76 arriving at amplifier circuitry 56 while bias voltage Vcc has an insufficient magnitude). In this scenario, other mapping settings may be used that mitigate or prevent instability in amplifier 56 and the corresponding reduction in receiver sensitivity and/or ACLR. If desired, envelope mapping circuitry 68 may include a database, polynomial coefficients, lookup table, or other data structure that includes multiple entries that each store a respective mapping setting. The envelope mapping settings may, for example, be generated and stored on device 10 during calibration, manufacture, and/or testing of device 10 (e.g., prior to use of device 10 by an end user). Control signal Vc1 may configure envelope mapping circuitry 68 to apply the selected mapping setting to envelope signal Vin.

In one suitable arrangement, control circuitry 60 may select a desired mapping setting from a set of different mapping settings for circuitry 68 based on sensor data gathered by device 10 (e.g., using one or more sensors in input-output devices 32 of FIG. 2). Sensor data gathered by device 10 may include, for example, impedance sensor data, current sensor data, reflectometer data, proximity sensor data (e.g., capacitive proximity sensor data or infrared proximity sensor data), touch sensor data, device position sensor data (e.g., accelerometer data, gyroscope data, compass data, or satellite location data), temperature data (e.g., operating temperature of device 10, operating temperature of communications circuitry within device 10, or any other desirable temperature data) etc. The sensor data may, for example, be indicative of the likelihood of reflected signals 76 destabilizing amplifier circuitry 56 and a corresponding decrease in receiver sensitivity and/or ACLR. By processing the sensor data, control circuitry 60 may identify when to use corresponding mapping settings in circuitry 68 to mitigate the amplifier instabilitiy.

In one suitable arrangement, control circuitry 68 may determine which mapping setting to use based on information about reflected signals 76 gathered by an impedance sensor such as reflectometer 62. As shown in FIG. 3, reflectometer 62 (sometimes referred to herein as directional coupler 62 or coupler 62) may be interposed between duplexer 58 and antenna 40. Reflectometer 62 may route radio-frequency signals to feedback receiver circuit 54 in transceiver circuitry 90 over feedback path 84. For example, reflectometer 62 may route reflected signals 76 and the corresponding transmit signals (e.g., as output by amplifier 56) to the feedback receiver 54 over path 84. Reflectometer 62 may, for example, include switching circuitry that has a first state for routing reflected signals 76 to path 84 and a second state for routing the transmit signals to path 84.

If desired, amplifier circuitry, mixer circuitry (e.g., downconverter circuitry), and/or conversion circuitry (e.g., analog-to-digital conversion circuitry) may be interposed on path 84. Feedback receiver 54 may include circuitry for measuring the phase and/or magnitude of the transmitted and reflected signals routed by reflectometer 62 over path 84. For example, feedback receiver 84 may include a digital signal processor or other circuitry (e.g., a power measurement circuit and a phase measurement circuit) that measures the phase and magnitude of the signals routed over path 54. If desired, feedback receiver 54 may provide the measured phase and magnitude information to control circuitry 60. Control circuitry 60 may use the phase and magnitude information to select a desired envelope mapping setting for circuitry 68.

In another suitable arrangement, feedback receiver 54 may process the phase and magnitude information measured for both the transmitted and reflected signals to generate reflection coefficient data associated with antenna 40. The reflection coefficient data may, for example, include complex reflection coefficient values F that are equal to the phase and magnitude of reflected signal 76 divided by the phase and magnitude of the corresponding transmitted signal. Feedback receiver 54 may convey reflection coefficient values F to control circuitry 60. Control circuitry 60 may use the reflection coefficient values to select a desired envelope mapping setting for circuitry 68. As an example, relatively high reflection coefficient values may be indicative of a relatively high likelihood that the reflected power will destabilize amplifier circuitry 56 (e.g., due to the relatively large impedance mismatch between the loaded antenna 40 and the transmission line), whereas relatively low reflection coefficient values may be indicative of antenna 40 operating in a free space environment. Control circuitry 60 may therefore select a mapping setting that mitigates the amplifier instability when relatively high reflection coefficient values are measured (e.g., a coefficient value that is greater than a predetermined threshold value), for example. Control circuitry 60 may configure mapping circuitry 68 to implement the selected mapping setting using control signals Vc1. Different mapping settings for mapping circuitry 68 may be associated with (e.g., may require) different DPD settings for predistortion circuitry 70. As an example, control circuitry 60 may configure predistortion circuitry 70 to implement a corresponding DPD setting (e.g., using control signals Vc2) when mapping circuitry 68 implements the selected mapping setting. The different DPD settings may include different operating curves as described in connection with FIG. 5. An input transmit signal received at predistortion circuitry 70 may be modified based on the implemented DPD setting to generate a corresponding output transmit signal from predistortion circuitry 70. If desired, the different DPD settings may be stored in a database, as polynomial coefficients, in a lookup table, or in any other data storage structure.

Feedback receiver 54 may generate antenna reflection coefficient values at periodic time intervals if desired (e.g., every millisecond, more often than every millisecond, less often than every millisecond, etc.). Control circuitry 60 may use a single reflection coefficient value or may use a combination of multiple reflection coefficient values (e.g., an average of multiple reflection coefficient values generated over a predetermined amount of time) in selecting the mapping setting to use.

This example is merely illustrative and, if desired, other sensor data may be used. For example, a capacitive proximity sensor or other sensor may generate proximity sensor data indicative of the proximity of a user or a user's body to antenna 40. Control circuitry 60 may process the proximity sensor data and may control circuitry 68 to implement a mapping setting that mitigates amplifier instability in response to determining that a user's body is within a predetermined distance of antenna 40 (e.g., a distance such that loading of antenna 40 will produce an excessive amount of reflected energy 76). In another example, current sensor circuitry may be formed within amplifier circuitry 56 and/or envelope tracking circuitry 66. The current sensor circuitry may detect currents associated with the instability of amplifier 56. In response to detecting such currents, control circuitry 60 may control circuitry 68 to implement a mapping setting that mitigates amplifier instability. In yet another example, receiver circuitry 52 may measure signal-to-noise ratio or other performance metric data (e.g., error rate values, noise floor values, noise values, etc.) associated with signals conveyed over receiver path 82. Control circuitry 60 may use this information for determining which mapping setting to use. For example, circuitry 52 may measure a relatively low signal-to-noise ratio when amplifier 56 has become destabilized by reflected signals 76 (e.g., due to the introduction of signal ringing and noise onto path 82 as shown by arrow 78). Control circuitry 60 may subsequently control circuitry 68 to implement a mapping setting that mitigates amplifier instability (e.g., in response to determining that the signal-to-noise ratio value is below a predetermined threshold value). In general, any desired sensor information may be used for selected a mapping setting for circuitry 68.

Figure 7:
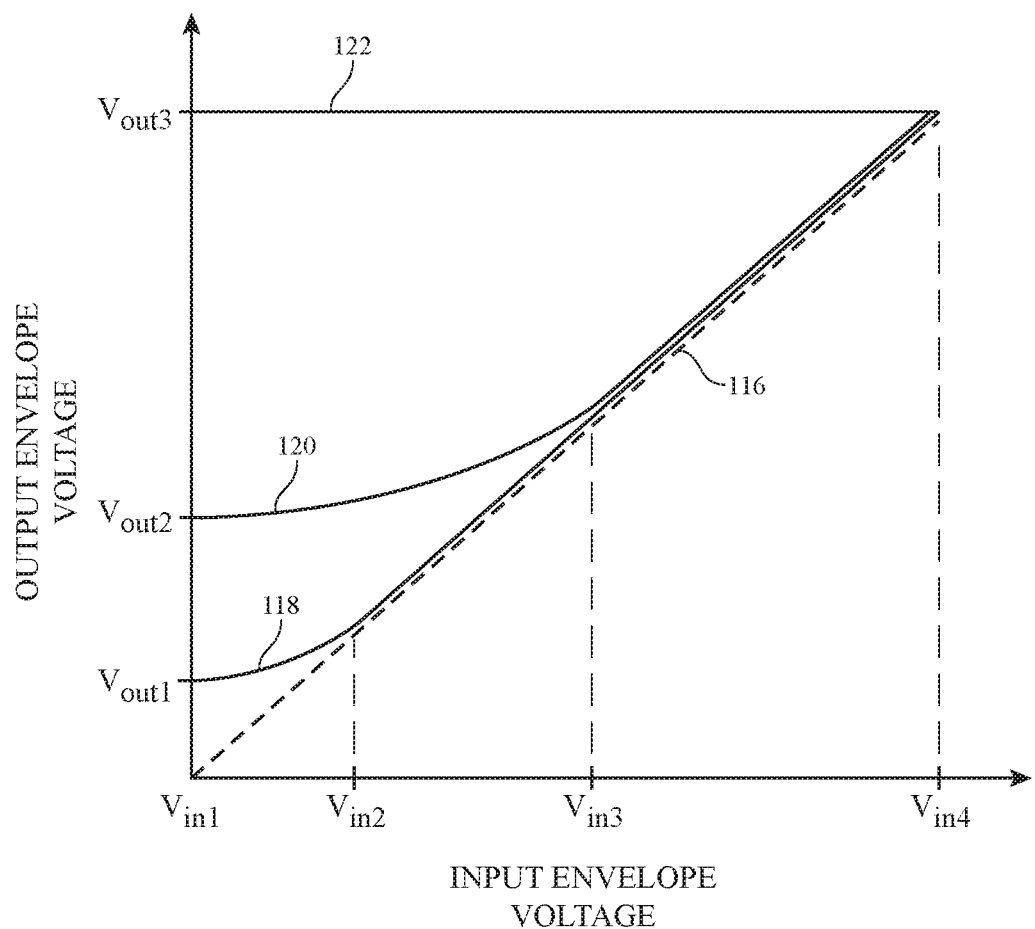
FIG. 7 is an illustrative diagram showing how envelope mapping circuitry may use different transfer function curves to map an input voltage to an output voltage in accordance with an embodiment.

FIG. 7 shows a graph of different mapping settings (e.g., transfer function curves) that may be used by envelope mapping circuitry 68. As shown in FIG. 7, input envelope voltage (i.e., the voltage at a given time of modulation envelope signal Vin at the input of circuitry 68) is plotted against output envelope voltage (i.e., the voltage at a given time for signal Vout at the output of circuitry 68). Dashed line 116 illustrates a first mapping between the input and output envelope voltage having a slope of one (e.g., where the input voltage is always equal to the output voltage). In other words, dashed line 116 illustrates the transfer function of circuitry 68 when circuitry 68 is configured to perform no modification to envelope signal Vin (e.g., when modulation envelope signal Vin bypasses envelope mapping circuitry 68 and is received directly by envelope tracking circuitry 66). In this scenario, a corresponding first set of power supply voltages Vcc may be supplied to power amplifier 56. When configured using first mapping 116, power amplifier 56 may be susceptible to current surges and receiver 52 may be vulnerable to high receiver channel noise and/or ACLR degradation at low input modulation envelope voltages due the arrival of time-delayed reflected signals 76 at the output of amplifier 56.

In order to mitigate instability of power amplifier 56, envelope mapping circuitry 68 may be configured to operate using a mapping setting (transfer function) as shown by curve 118. Curve 118 may deviate from line 116 from input voltages Vin1 to Vin2. In other words, at voltages Vin1 to Vin2, when configured using mapping setting 118, circuitry 68 may generate output envelope voltages that are greater than when configured using mapping setting 116 (e.g., setting 118 may be a more conservative mapping setting than curve 116). At the same time, circuitry 68 may consume more power when configured using setting 118 than when configured using setting 116. When the corresponding modified envelope signal Vout is provided to envelope tracking circuitry 66, portions of modified envelope signal Vout (e.g., the output voltages corresponding to input voltages from Vin1 to Vin2) may be greater than the voltages of the envelope signal Vin. Envelope tracking circuitry 66 may therefore generate a second set of power supply voltages that are greater than the first set of power supply voltages for input envelope voltages from Vin1 to Vin2 when configured using second mapping 118. The second set of power supply voltages may be the same as the first set of power supply voltages at voltages corresponding to input envelope voltages from Vin2 to Vin4 (e.g., because curve 118 is the same as curve 116 at voltages from Vin2 to Vin4). This deviation in curve 118, the corresponding increase in the magnitude of signal Vout, and the corresponding increase in bias voltage Vcc for input envelope voltages from Vin1 to Vin2 may serve to mitigate or prevent instability in amplifier circuitry 56 due to the delayed arrival of a first amount of reflected signals 76 at amplifier circuitry 56, for example.

In some scenarios, mapping setting 118 may be insufficient for mitigating all of the instability of amplifier 56 (e.g., in scenarios where the antenna reflection coefficient is large enough to affect power amplifier 56 even while mapping circuitry 68 is configured using setting 118). In these scenarios, envelope mapping circuitry 68 may be configured to operate using a more conservative mapping setting such as a mapping setting defined by curve 120. Curve 120 may deviate from curve 116 at input voltages Vin1 to Vin3 (where voltage Vin3 is greater than voltage Vin2). In other words, at voltages Vin1 to Vin3, when configured using mapping setting 120, circuitry 68 may generate output envelope voltages that are greater than when configured using mapping setting 118. At the same time, circuitry 68 may consume more power when configured using setting 120 than when configured using setting 118. When the corresponding modified envelope signal Vout is provided to envelope tracking circuitry 66, portions of modified envelope signal Vout (e.g., the output voltages corresponding to input voltages from Vin1 to Vin3) may be greater than the voltages of envelope signal Vin. Envelope tracking circuitry 66 may therefore generate a third set of power supply voltages that are greater than the first and second sets of power supply voltages for input envelope voltages from Vin1 to Vin3. The third set of power supply voltages may be the same as the first set of power supply voltages at voltages corresponding to input envelope voltages Vin3 to Vin4 (e.g., because the curve 120 is the same as curve 116 from voltage Vin3 to voltage Vin4). This deviation in curve 120, the corresponding increase in the magnitude of signal Vout, and the corresponding increase in bias voltage Vcc for input envelope voltages from Vin1 to Vin3 may serve to mitigate or prevent instability in amplifier circuitry 56 due to the delayed arrival of a second amount of reflected signals 76 at amplifier 56, for example (e.g., a greater amount of reflected signals than are mitigated by setting 118).

In other scenarios, mapping setting 120 may still be insufficient for mitigating all of the instability of amplifier 56 (e.g., in scenarios where the antenna reflection coefficient is large enough to affect power amplifier 56 even while mapping circuitry 68 is configured using setting 120). In these scenarios, envelope mapping circuitry 68 may be configured to operate using a more conservative mapping setting such as a mapping setting defined by curve 122 (e.g., curve 122 may be the most conservative possible mapping function for circuitry 68). When envelope mapping circuitry 68 is configured to operate using curve 122, every input envelope voltage (e.g., each of the voltages from Vin1 to Vin4) is mapped to a constant voltage Vout3. As such, envelope tracking circuitry 68 will always generate power supply voltages corresponding to voltage Vout3 regardless of the actual input modulation envelope voltage of the transmit signal.

In practice, while configured using mapping 122, envelope mapping circuitry 68 may reduce all power amplifier current surges and receiver channel noise regardless of the amount of reflected signals 76 (e.g., regardless of the measured antenna reflection coefficient). At the same time, circuitry 68 and amplifier 56 may consume excessive power when circuitry 68 is configured using mapping 122. Curves 116, 118, 120, and 122 of FIG. 7 are merely illustrative. In general, any desired number of transfer function curves (mapping settings) may be used to balance power consummation of device 10 with amplifier instability mitigation (e.g., with different amounts of reflected antenna signals). The mapping settings may have any desired one-to-one shape (e.g., between curves 122 and 116). Each mapping setting may be associated with a different DPD setting implemented by predistortion circuitry 70. As examples, when circuitry 68 implements mapping 118, predistortion circuitry 70 may implement a first DPD setting, and when circuitry 68 implements mapping 122, predistortion circuitry 70 may implement a second DPD setting that is different from the first DPD setting.

Control circuitry 60 may process sensor data such as reflection coefficient data or other antenna impedance data received from feedback receiver 54, performance metric data such as signal-to-noise ratio data generated by receiver 52, or other sensor data in determining which of mapping settings 116, 118, 120, and 122 to use. For example, if the sensor data indicates that there is a relatively low probability of amplifier 56 becoming unstable (e.g., if the sensor data indicates that antenna 40 is being operated in a free space environment, if a relatively low or zero-magnitude reflection coefficient is measured, if a relatively high signal-to-noise ratio value is measured, etc.), control circuitry 60 may configure circuitry 68 to implement mapping setting 116. This may minimize power consumption within device 10 without any risk of amplifier instability due to the delayed arrival of reflected signals 76 at amplifier 56. If the sensor indicates that there is a relatively high probability of amplifier 56 becoming unstable (e.g., if the sensor data indicates that a user's body is adjacent to antenna 40, if a relatively high reflection coefficient is measured, if a relatively low signal-to-noise ratio value is measured, etc.), control circuitry 60 may configure circuitry 68 to implement mapping settings 118, 120, or 122. While this will consume more power than using mapping setting 116, mapping settings 118, 120, and 120 may mitigate amplifier instability and thereby minimize any decrease in the sensitivity of receiver 52 due to the delayed arrival of reflected signals 76 at amplifier 56. If desired, more conservative mapping settings (e.g., mapping settings 120 or 122) may be used when greater reflection coefficients are measured than when lesser reflection coefficients are measured (e.g., because greater reflection coefficients may be indicative of more reflected energy returning to amplifier 56 thereby increasing amplifier instability relative to lower reflection coefficients), thereby balancing power consumption with amplifier stability in wireless circuitry 34.

Figure 8:
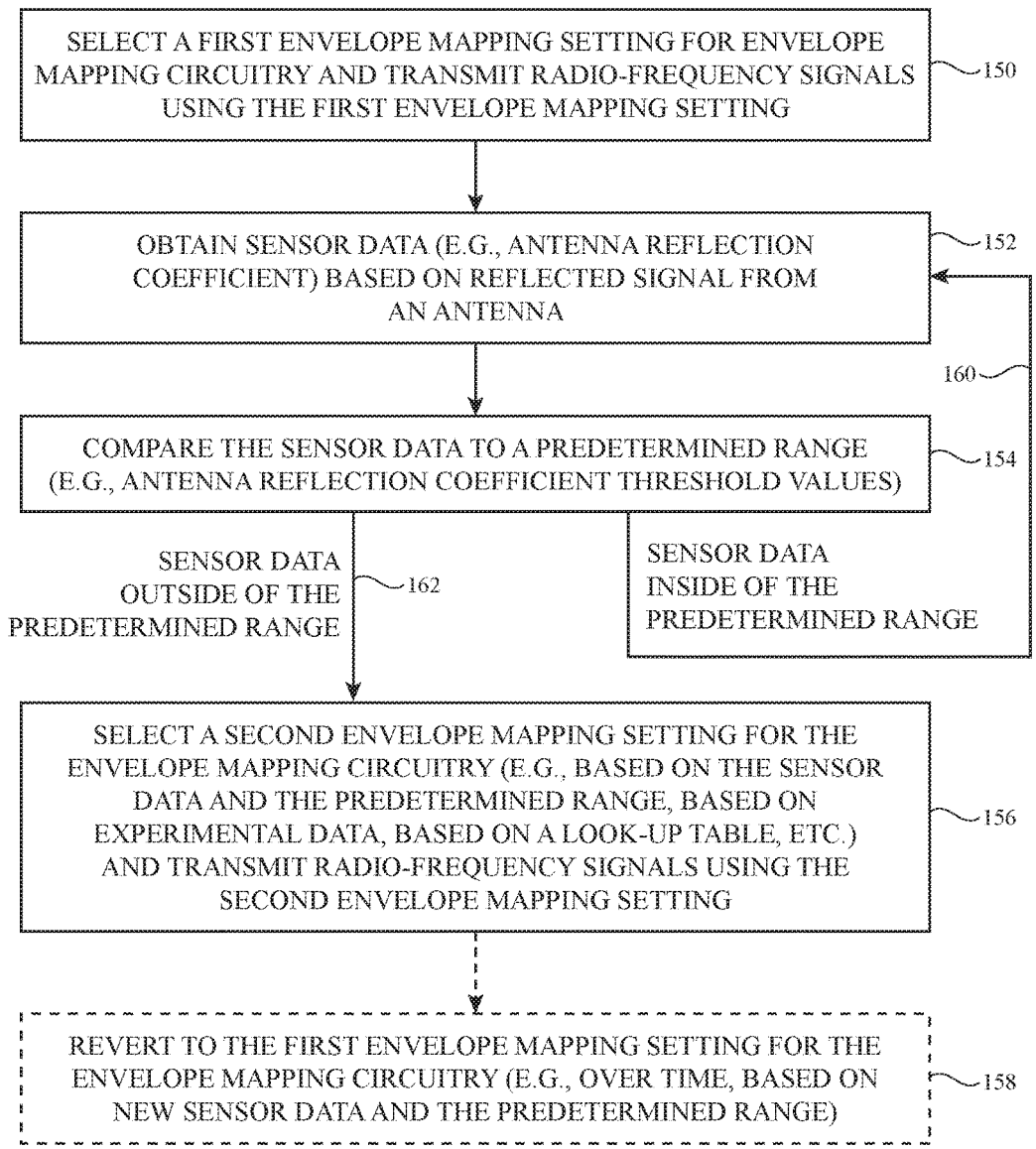
FIG. 8 is a flowchart of illustrative steps that may be performed by an electronic device in actively selecting settings for envelope mapping circuitry in accordance with an embodiment.

FIG. 8 is a flowchart of illustrative steps that may be performed by control circuitry 60 and envelope mapping circuitry 68 in dynamically adjusting mapping settings to balance power consumption with amplifier instability mitigation. The steps of FIG. 8 may, for example, be performed during transmission of radio-frequency signals by transmitter 50 and antenna 40 (e.g., over transmit path 80 of FIG. 3).

At step 150, control circuitry 60 may select a first mapping setting (e.g., a first transfer function) for mapping circuitry 68 and may provide a control signal (e.g., control signal Vc1) to envelope mapping circuitry 68 to configure mapping circuitry 68 to implement the first mapping setting. Control circuitry 60 may also provide a control signal (e.g. control signal Vc2) to predistortion circuitry 70 to implement an appropriate DPD setting associated with the first mapping setting for mapping circuitry 68. As an example, control circuitry 60 may control mapping circuitry 68 to implement mapping setting 118 of FIG. 7 and control predistortion circuitry 70 to implement a DPD setting that corresponds to mapping setting 118.

Transmitter circuit 50 may transmit a radio-frequency transmit signal Vi to amplifier circuitry 56. Radio-frequency transmit signal Vi may have a modulation envelope Vin that is provided to envelope mapping circuitry 68. Envelope mapping circuitry 68 may generate modified envelope signal Vout based on envelope signal Vin and the selected first mapping setting. Envelope tracking circuitry 66 may generate bias voltage Vcc based on modified envelope signal Vout (e.g., by amplifying signal Vout using an amplifier in circuity 66). Amplifier circuitry 56 may amplify transmit signal Vi while powered using bias voltage Vcc (e.g., a bias voltage that varies over time as determined by modified envelope signal Vout). Antenna 40 may subsequently transmit the amplified transmit signal.

At step 152, control circuitry 60 may obtain sensor data gathered by sensor circuitry in device 10 (e.g., sensor data gathered by sensor devices 32 in FIG. 2 while transmitting radio-frequency signals over antenna 40 using the first mapping setting). For example, reflectometer 62 may convey the amplified transmit signal and corresponding reflected signals 76 to feedback receiver 54. Feedback receiver circuitry 54 may measure the phase and magnitude of the amplified transmit signal and the corresponding reflected signals 76. Feedback receiver circuitry 54 may convey the phase and magnitude information to control circuitry 60 or may generate antenna reflection coefficient values $\Gamma$ based on the measured phase and magnitude information. Feedback receiver 54 may convey the antenna reflection coefficient values to control circuitry 60. If desired, control circuitry 60 and/or receiver 54 may generate an average reflection coefficient value based on two or more antenna reflection coefficient measurements generated by receiver 54. Control circuitry may store the generated antenna reflection coefficient values and other sensor data as sensor data 74. This example is merely illustrative. If desired, other sensor data such as current sensor data generated by a current sensor in circuitry 66 and/or 56, noise data generated by signal-to-noise ratio measurement circuitry or other noise measurement circuitry in receiver 52, proximity sensor data generated by a proximity sensor, temperature sensor data generated by a temperature sensor, or any other desired sensor data may be provided to control circuitry 60 and stored as sensor data 74.

At step 154, control circuitry 60 may compare the obtained sensor data 74 to a predetermined range of sensor data. The predetermined range of sensor data may be defined by a minimum threshold value and/or a maximum threshold value. The threshold values may, for example, be determined by calibration data and may be stored on device 10 prior to operation of device 10 by an end user. If the generated sensor data is within the predetermined range of sensor data (e.g., less than the maximum threshold value and/or greater than the minimum threshold value), processing may loop back to step 152 via path 160.

For example, control circuitry 60 may compare one or more reflection coefficient values generated by feedback receiver circuit 54 to a maximum reflection coefficient threshold value. If the generated antenna reflection coefficient value is less than the maximum reflection coefficient threshold value, this may be indicative of a relatively low likelihood of reflected signals generating instability in amplifier 56 and the current mapping setting may already be sufficient to operate circuitry 34 without reducing receiver sensitivity. In another example, control circuitry 60 may compare current measured by a current sensor within circuitry 66 and/or 56 to a maximum current threshold value. If the measured current is less than the maximum current threshold value, this may be indicative of relative stability in amplifier 56 and the current mapping setting may already be sufficient to operate circuitry 34 without reducing receiver sensitivity. In another example, control circuitry 60 may compare a signal-to-noise ratio value measured by a noise sensor in receiver 52 to a minimum signal-to-noise ratio threshold value. If the measured signal-to-noise ratio value is greater than the minimum signal-to-noise ratio threshold value, this may be indicative of relative stability in amplifier 56 and the current mapping setting may already be sufficient to operate circuitry 34 without reducing receiver sensitivity. In yet another example, control circuitry 60 may compare a proximity sensor value measured by a proximity sensor in device 10 to a minimum proximity threshold value. If the measured proximity sensor value is greater than the minimum proximity threshold value (e.g., if an external object is within a predetermined distance from device 10), this may be indicative of a relative low likelihood of reflected signals generating instability in amplifier 56 and the current mapping setting may already be sufficient to operate circuitry 34 without reducing receiver sensitivity and/or transmitter ACLR. Control circuitry 60 may continue to monitor sensor data gathered by device 10 and may continue to compare the sensor data to the predetermined threshold value (e.g., as shown by loop path 160).

If desired, control circuitry 60 may control mapping circuitry 68 to implement a less conservative mapping setting that consumes less power than the current mapping setting. For example, if the first mapping setting is setting 118 of FIG. 7, control circuitry 60 may control circuitry 68 to implement setting 116 while reverting back to step 152 over path 160. This may serve to minimize overall power consumption in device 10 without sacrificing wireless performance.

If the generated sensor data is outside of the predetermined range of sensor values (e.g., greater than the maximum threshold value or less than the minimum threshold value), processing may proceed to step 156 as shown by path 162. At step 156, control circuitry 60 may select a second envelope mapping setting and may control mapping circuitry 68 to implement the second mapping setting (e.g., using control signal Vc1). The second envelope mapping setting may, for example, be a more conservative mapping setting that consumes more power than the first mapping setting. For example, in a scenario where a first envelope mapping setting is defined by curve 118 of FIG. 7, the second envelope mapping setting may be defined by curve 120 of FIG. 7. Control circuitry 60 may select the mapping setting based on the magnitude of the sensor data or based on any other desired criteria. For example, if the measured reflection coefficient has a first magnitude, control circuitry 60 may use mapping setting 120 of FIG. 7, whereas if the measured reflection coefficient has a second magnitude that is greater than the first magnitude, control circuitry 60 may use mapping setting 122 of FIG. 7.

Envelope mapping circuitry 68 may subsequently generate modified envelope signal Vout based on envelope signal Vin and the selected second mapping setting (e.g., curve 120 of FIG. 7). Envelope tracking circuitry 66 may generate bias voltage Vcc based on modified envelope signal Vout (e.g., by amplifying signal Vout using an amplifier in circuit 66). Amplifier circuitry 56 may amplify transmit signal Vi while powered using bias voltage Vcc (e.g., a bias voltage that varies over time as determined by modified envelope signal Vout). Antenna 40 may subsequently transmit the amplified transmit signal (e.g., while mapping circuitry 68 is configured using the second mapping setting).

The second mapping setting may ensure that the time-delayed reflected signals 76 do not return to amplifier circuitry 56 at a time when bias voltage Vcc is less than the magnitude of transmit signal Vi. This may ensure that amplifier 56 remains stable, thereby mitigating or preventing any reduction in receiver sensitivity for receiver 52 and/or the ACLR of amplifier 56. If desired, at optional step 158, control circuitry 60 may configure mapping circuitry 68 to revert back to the first mapping setting (e.g., to conserve power within device 10 over time). For example, control circuitry 60 may control mapping circuitry 68 to revert back to the first mapping setting after a predetermined amount of time, after the measured sensor values return to the predetermined range of sensor values, etc.

Figure 9:
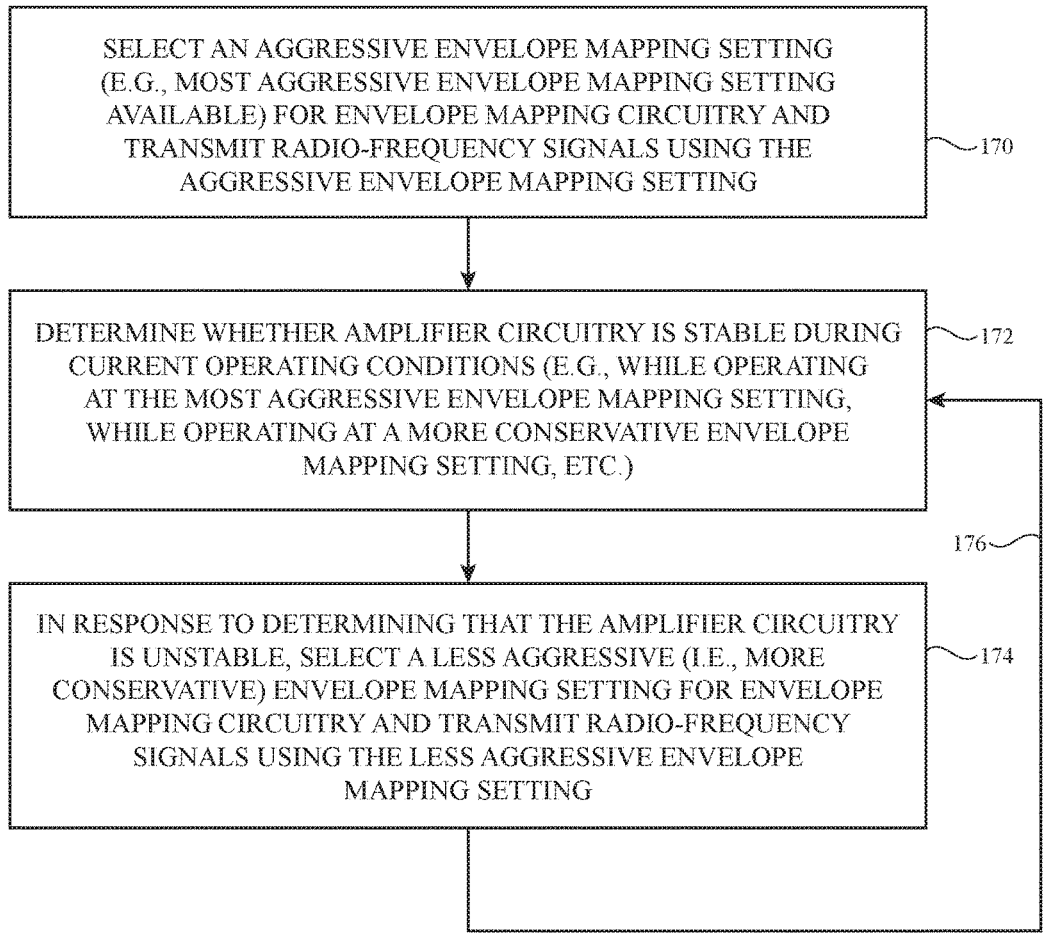
FIG. 9 is a flowchart of illustrative steps that may be performed by an electronic device in selecting settings for envelope mapping circuitry based on amplifier circuitry stability data in accordance with an embodiment.

In another suitable arrangement, control circuitry 60 may control mapping circuitry 68 to implement progressively more and more conservative settings (e.g., to use more and more conservative transfer functions). As an example, in scenarios where device 10 consuming excess power is less relevant, but maintaining amplifier stability and/or reducing receiver noise is crucial (e.g., when device 10 is docked to a power supply apparatus that may inhibit antenna performance, but device 10 is required to maintain communications links with other devices), communications circuitry 34 in device 10 may use illustrative steps as shown in FIG. 9 to operate envelope mapping circuitry 60 in wireless communications circuitry 34. The steps as shown in FIG. 9 operate the envelope mapping circuitry by focusing on amplifier stability (e.g., by reducing the likelihood of current surges in amplifier circuitry 56 and high receiver noise at receiver 52, thereby enhancing wireless performance).

At step 170, control circuitry 60 may select an aggressive mapping setting (e.g., a most aggressive envelope mapping setting available to mapping circuitry 68, a most aggressive transfer function, mapping setting 118 in FIG. 7) for mapping circuitry 68. Control circuitry 60 may also provide a control signal (e.g., control signal Vc1) to envelope mapping circuitry 68 to implement the aggressive envelope mapping setting at envelope mapping circuitry 68. Control circuitry 60 may provide control signal Vc2 to predistortion circuitry 70 to implement a DPD setting associated with the implemented envelope mapping setting of mapping circuitry 68, if desired.

As described in connection with step 150 of FIG. 8, transmitter circuit 50 may transmit a radio-frequency transmit signal Vi to amplifier 56. Amplifier 56 may amplify transmit signal Vi based on bias voltage Vcc generated using the current setting of mapping circuitry 68 (e.g., the aggressive mapping setting of mapping circuitry 68). As illustrated in FIG. 7, curve 118 may be the most aggressive envelope mapping curve of curves 118, 120, and 122. Amplifier 56 may generate a corresponding amplified transmit signal based on curve 118. As such, during step 170, antenna 40 may transmit the amplified radio-frequency signals generated based on curve 118, as an example.

At step 172, control circuitry 60 may determine whether amplifier circuitry 56 in FIG. 3 is stable during the current operating conditions (e.g., while operating the envelope mapping circuitry at the current mapping setting, while operating at the most aggressive envelope mapping circuitry). As an example, device 10 may include sensor circuitry such as amplifier current sensor that generates current data for amplifier circuitry 56, indicative of possible current surges in amplifier circuitry 56. The amplifier current sensor may provide current data for amplifier circuitry 56 to control circuitry 60. Control circuitry 60 may use the provided current data to determine whether the current setting of mapping circuitry 68 is sufficient to mitigate possible current surges in amplifier circuitry 56 (e.g., whether current surges occur in amplifier circuitry 56 while using the current setting). As an example, control circuitry 60 may compare the current data to a predetermined range of sensor values to determine whether current surges occur while using the current setting.

This is merely illustrative. If desired, the sensor circuitry may include the different sensor circuitry as described in connection with step 152 of FIG. 8 (e.g., reflectometer 62, current sensor in circuitry 66, noise sensor in receiver 52, etc.). Control circuitry 60 may use sensor data 74 obtained from one or more of the different sensors to adjust the setting of mapping circuitry 68 (e.g., using control signal Vc1) as examples.

At step 174, in response to determining that amplifier circuitry 56 is unstable (e.g., the current sensor data is outside of a predetermined range), control circuitry 60 may select a less aggressive (i.e., more conservative) envelope mapping setting for the envelope mapping circuitry (e.g., a mapping setting that provides increased amplifier stability and reduced receiver noise for higher antenna reflection coefficients at the expense of increase power consumption for communications circuitry 34). Although the less aggressive envelope mapping setting may consume more power than a more aggressive envelope mapping setting, the less aggressive envelope mapping setting may improve the stability of amplifier circuitry 56. In the scenario where mapping setting 118 in FIG. 7 was used as the most aggressive envelope mapping setting, mapping setting 120 may be used instead, in response to determining that amplifier circuitry 56 is unstable while operating envelope mapping circuitry 68 using setting 118.

After processing step 174, operation may proceed back to step 172 via loop path 176. If control circuitry 60 determines that amplifier circuitry 56 is stable during the current operating conditions (e.g., while operating using mapping setting 120), envelope mapping circuitry 68 may continue to operate using the current envelope mapping settings (e.g., using the current transfer function curve). While control circuitry 60 and mapping circuitry 68 perform steps 170, 172, and 174, control circuitry 60 may control mapping circuitry 68 to implement more and more conservative settings without reversion to more aggressive settings. By continually operating at more and more conservative settings, mapping circuitry 68 reduces the likelihood that communications links with other devices will be dropped (e.g., due to high receiver noise).

Figure 10:
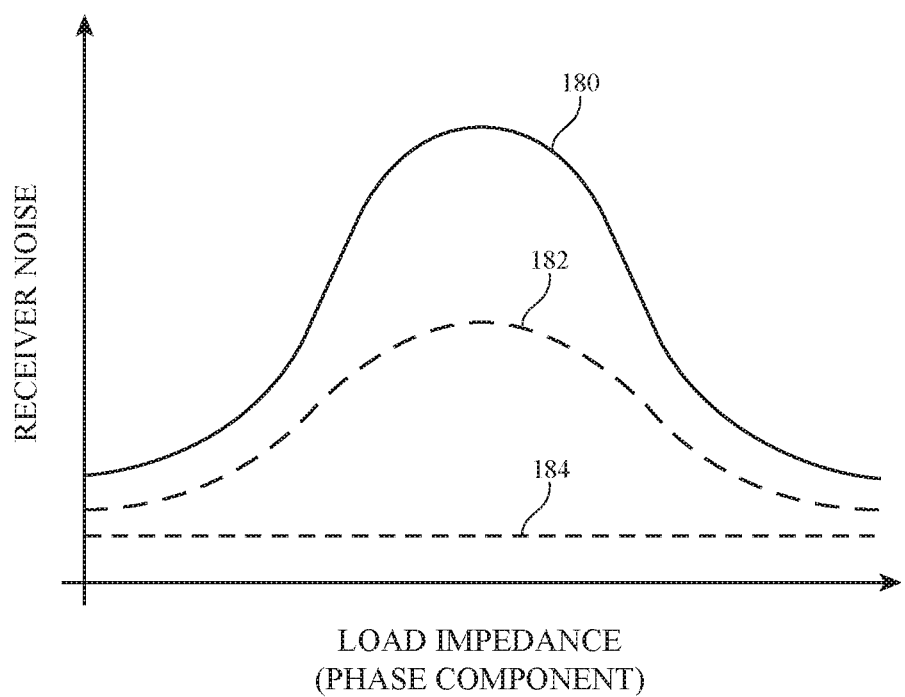
FIG. 10 is an illustrative plot of receiver noise versus load impedance for different envelope mapping circuitry settings in accordance with an embodiment.

FIG. 10 shows an example of the effect of using different transfer characteristics (e.g., using different transfer function curves 118, 120, and 122 in FIG. 7) to operate envelope mapping circuitry such as envelope mapping circuitry 68 in FIG. 3. As shown in FIG. 10, without envelope mapping circuitry 68, receiver noise may peak at a corresponding load impedance due to high antenna reflection coefficient from impedance mismatch caused by an external object (as shown by curve 180). For the same antenna reflection coefficient, by using envelope mapping circuitry 68 having transfer characteristics of curve 118, the receiver noise peak may be reduced at the corresponding load impedance. However, by using envelope mapping circuitry 68 having transfer characteristics of curve 120, the receiver noise peak may be significantly reduced at the corresponding load impedance, such that even when there is high antenna signal reflection, little noise is perceived on the receiver channel.

In practice, curve 180 may also shift because of different transmit conditions for antenna 40 (e.g., free space operation, operation with a nearby external object, etc.). During free space operation, it may be undesirable to operation mapping circuitry 68 using curve 120, as mapping circuitry 68 configured to operate using curve 120 may consume excess power compared to operation using curve 118. Control circuitry 60 may therefore react to real time changes in the transmit conditions of antenna 40 by supplying control signals to mapping circuitry 68 in real time. As an example, mapping circuitry 68 may switch between curves 118 and 120 in real time. By performing real time switching, mapping circuitry 68 may balance between the power consumption of device 10 and wireless communications performance as necessary.

If desired, control circuitry 60 may perform other operations to mitigate amplifier instability in addition to or in place of adjusting the envelope mapping settings of circuitry 68. For example, control circuitry 60 may reduce the transmit power level of the transmitted signals, may adjust impedance matching circuitry (e.g., a switched inductive or capacitive array) coupled to antenna 40, switch on an attenuator in the transmit path 80 into use to reduce reflected power, reduce the bandwidth of envelope tracking circuitry 66, or switch another antenna into use in response to determining that amplifier instability is occurring or is likely to occur (e.g., based on sensor data generated by device 10).

Control circuitry 28 and/or control circuitry 60 on device 10 may be configured to perform these operations (e.g., the operations of FIGS. 8 and 9) using hardware (e.g., dedicated hardware or circuitry) and/or software (e.g., code that runs on the hardware of device 10). Software code for performing these operations is stored on non-transitory computer readable storage media (e.g., tangible computer readable storage media). The software code may sometimes be referred to as software, data, program instructions, instructions, or code. The non-transitory computer readable storage media may include non-volatile memory such as non-volatile random-access memory (NVRAM), one or more hard drives (e.g., magnetic drives or solid state drives), one or more removable flash drives or other removable media, other computer readable media, or combinations of these computer readable media or other storage. Software stored on the non-transitory computer readable storage media may be executed on the processing circuitry of control circuitry 28 and/or control circuitry 60. The processing circuitry may include application-specific integrated circuits with processing circuitry, one or more microprocessors, or other processing circuitry.

The foregoing is merely illustrative of the principles of this invention and various modifications can be made by those skilled in the art without departing from the scope and spirit of the invention. The foregoing embodiments may be implemented individually or in any combination.

What is claimed is:

1. An electronic device, comprising:
   an antenna;
   transceiver circuitry configured to transmit radio-frequency signals over the antenna;
   power supply circuitry configured to generate a power supply voltage based on an envelope mapping setting and the radio-frequency signals transmitted by the transceiver circuitry;
   amplifier circuitry interposed between the transceiver circuitry and the antenna and configured to amplify the transmitted radio-frequency signals using the power supply voltage generated by the power supply circuitry;
   sensor circuitry configured to generate sensor data; and
   control circuitry coupled to the power supply circuitry and configured to adjust the envelope mapping setting based on the sensor data.

2. The electronic device defined in claim 1, wherein the power supply circuitry is configured to generate the power supply voltage based on a modulation envelope of the radio-frequency signals transmitted by the transceiver circuitry.

3. The electronic device defined in claim 1, wherein the sensor circuitry comprises a directional coupler interposed between the amplifier circuitry and the antenna and the sensor data comprises phase and magnitude data.

4. The electronic device defined in claim 3, wherein the transceiver circuitry comprises:
a feedback receiver coupled to the directional coupler via a feedback path and configured to generate the phase and magnitude data based on radio-frequency signals routed by the directional coupler over the feedback path, wherein the sensor data further comprises an antenna reflection coefficient generated from the phase and magnitude data.

5. The electronic device defined in claim 4, wherein the control circuitry is configured to adjust the envelope mapping setting based on a comparison between the antenna reflection coefficient and a threshold value.

6. The electronic device defined in claim 5, wherein the control circuitry is configured to reduce a transmit output power level of the transmit radio-frequency signals in response to determining that the antenna reflection coefficient exceeds the threshold value.

7. The electronic device defined in claim 5, wherein the control circuitry is configured to adjust the envelope mapping setting to an additional envelope mapping setting in response to determining that the antenna reflection coefficient exceeds the threshold value, and the power supply circuitry is configured to generate the power supply voltage based on the additional envelope mapping setting.

8. The electronic device defined in claim 7, wherein the control circuitry is configured to control the power supply circuitry to maintain the envelope mapping setting in response to determining that the antenna reflection coefficient is less than the threshold value.

9. The electronic device defined in claim 1, wherein the transceiver circuitry comprises a transmitter circuit and a receiver circuit and the electronic device further comprises filter circuitry having first, second, and third terminals respectively coupled to the transmitter circuit, the receiver circuit, and the antenna.

10. The electronic device defined in claim 9, wherein the sensor circuitry comprises a noise sensor in the receiver circuit and the sensor data comprises signal-to-noise ratio data generated by the noise sensor based on a signal received by the receiver circuit.

11. The electronic device defined in claim 1, wherein the sensor circuitry comprises a current sensor coupled to the amplifier circuitry and the sensor data comprises current data associated with a current within the amplifier circuitry generated by the current sensor.

12. The electronic device defined in claim 1, wherein the sensor circuitry comprises a proximity sensor and the sensor data comprises proximity sensor data generated by the proximity sensor.

13. The electronic device defined in claim 1, wherein the control circuitry is configured to change the envelope mapping setting to an additional envelope mapping setting in response to determining that the sensor data is outside of a range of predetermined values.

14. The electronic device defined in claim 13, wherein the control circuitry is configured to maintain the envelope mapping setting in response to determining that the sensor data is within the range of predetermined values.

15. The electronic device defined in claim 14, wherein the sensor circuitry comprises a directional coupler, the sensor data comprises an antenna reflection coefficient generated by the control circuitry based on signals routed by the directional coupler, and the range of predetermined values comprises a range of predetermined antenna reflection coefficient values.

16. The electronic device defined in claim 13, wherein the control circuitry is configured to revert back to the envelope mapping setting from the additional envelope mapping setting after a given time period.

17. The electronic device defined in claim 1, wherein the sensor circuitry comprises a temperature sensor and the sensor data comprises temperature data generated by the temperature sensor.

18. An electronic device comprising:
amplifier circuitry configured to generate an amplified signal by amplifying a radio-frequency signal using a bias voltage;
an antenna coupled to the amplifier circuitry and configured to transmit the amplified signal;
power supply circuitry configured to generate the bias voltage by applying a transfer function to an envelope signal associated with the radio-frequency signal;
a radio-frequency coupler coupled between the amplifier circuitry and the antenna;
receiver circuitry configured to receive the amplified signal over the radio-frequency coupler and to generate phase and magnitude information associated with the amplified signal; and
control circuitry configured to adjust the transfer function applied by the power supply circuitry based on the generated phase and magnitude information.

19. The electronic device defined in claim 18, wherein the phase and magnitude information associated with the amplified signal comprises information associated with a forward transmitted portion of the amplified signal and information associated with a reflected portion of the amplified signal.

20. The electronic device defined in claim 18, further comprising:
digital predistortion circuitry coupled to an input of the amplifier circuitry and configured to apply a digital predistortion to the radio-frequency signal, wherein the digital predistortion is applied based on a predistortion setting of the digital predistortion circuitry and the control circuitry is configured to adjust the predistortion setting based on the generated phase and magnitude information.

* * * * *